(12) United States Patent
Ogawa

(10) Patent No.: US 8,531,105 B2
(45) Date of Patent: Sep. 10, 2013

(54) LIGHT EMITTING DEVICE

(75) Inventor: Satoru Ogawa, Anan (JP)

(73) Assignee: Nichi Corporation, Anan-shi, Tukushima (JP)

( * ) Notice: Subject to any disclaimer, the term of this patent is extended or adjusted under 35 U.S.C. 154(b) by 0 days.

(21) Appl. No.: 12/944,908

(22) Filed: Nov. 12, 2010

(65) Prior Publication Data

US 2011/0057553 A1    Mar. 10, 2011

Related U.S. Application Data

(62) Division of application No. 11/288,352, filed on Nov. 29, 2005, now Pat. No. 7,833,073.

(30) Foreign Application Priority Data

Nov. 29, 2004    (JP) .................................. 2004-344484

(51) Int. Cl.
  *H05B 33/02*    (2006.01)
(52) U.S. Cl.
  USPC .......................................................... 313/512
(58) Field of Classification Search
  USPC .......................................................... 313/512
  See application file for complete search history.

(56) References Cited

U.S. PATENT DOCUMENTS

| 3,237,272 | A | 3/1966 | Kallander |
|---|---|---|---|
| 4,587,717 | A | 5/1986 | Daniele et al. |
| 5,814,533 | A | 9/1998 | Shakuda |
| 6,642,618 | B2 | 11/2003 | Yagi et al. |
| 2002/0158257 | A1 | 10/2002 | Nei |
| 2003/0063832 | A1 | 4/2003 | Hellman et al. |
| 2004/0067366 | A1* | 4/2004 | Gorczyca ...................... 428/413 |
| 2004/0251469 | A1 | 12/2004 | Yatsuda et al. |
| 2005/0161771 | A1 | 7/2005 | Suehiro et al. |
| 2006/0049421 | A1 | 3/2006 | Suehiro et al. |
| 2006/0261364 | A1 | 11/2006 | Suehiro et al. |

FOREIGN PATENT DOCUMENTS

| JP | 11-177129 A | 7/1999 |
|---|---|---|
| JP | 2002-203989 A | 7/2002 |
| JP | 2004-200531 A | 7/2004 |
| WO | 2004/082036 A1 | 9/2004 |

* cited by examiner

*Primary Examiner* — Anh Mai
*Assistant Examiner* — Hana Featherly
(74) *Attorney, Agent, or Firm* — Smith Patent Office

(57) ABSTRACT

A light emitting device having excellent thermal resistance and light resistance is provided. The light emitting device is manufactured by disposing a substrate electrode having a predetermined conductive pattern provided thereon to a substrate of a ceramic; flip-chip mounting a light emitting element having an n-side electrode and a p-side electrode on a common surface side onto the substrate electrode in a face-down manner and electrically connecting thereto; heating a glass to a temperature from the glass transition temperature to below the melting point of the glass, until the glass shows its softened state; and fixing the softened glass to the substrate by way of pressing to cover the light emitting element with the glass.

24 Claims, 23 Drawing Sheets

LIGHT EMITTING DEVICE

CROSS REFERENCE TO RELATED APPLICATIONS

This application is a divisional application of U.S. patent application Ser. No. 11/288,352 filed on Nov. 29, 2005, now U.S. Pat. No. 7,833,073. U.S. patent application Ser. No. 11/288,352 claims priority to Japanese Patent Application No. 2004-344484, filed on Nov. 29, 2004. The disclosures of U.S. patent application Ser. No. 11/288,352 and Japanese Patent Application No. 2004-344484 are hereby incorporated by reference.

BACKGROUND OF THE INVENTION

1. Field of the Invention

The present invention relates to a light emitting device used in a backlight of a portable telephone, a display capable of showing various data, a light source for various sensors such as a line sensor, an indicator, and to a light emitting device used for an indication of various measuring instruments and outdoor guide plates. The present invention especially relates to a light emitting device having a high reliability and one that exhibits excellent heat resistance and light stability.

2. Discussion of the Related Art

In a conventional light emitting device, a light emitting element is mounted on a predetermined substrate and an encapsulating member is disposed to cover the light emitting device. The light emitting element is bonded to a desired member such as a lead frame or a printed wiring substrate, and molded with an encapsulating member which is made of a light-transmissive resin. An organic material, such as epoxy resin and silicone resin, is usually used for the encapsulating member. With this light emitting device, light is emitted from the light emitting element by applying electric current to the light emitting element. The emitted light penetrates the encapsulating member such as an epoxy resin and is transmitted through the air.

When an encapsulating member of an organic material, such as epoxy resin and silicone resin, is used to cover the light emitting element, there have been cases where the organic material deteriorates due to the heat and light generated from the light emitting element. There have also been cases where a component in an organic material causes deterioration of a printed wiring substrate, an electrode, and the like. As a result, a decrease in the optical characteristics, the electric characteristics, and the reliability characteristics of the light emitting device may occur.

A chip-type light emitting device has been known, in which an organic material such as epoxy resin is replaced with a low-melting point glass in order to solve such a problem. (For instance, see Japanese Unexamined Patent Publication Nos. 11-177129, 2002-203989, and 2004-200531.) FIG. 23 is a schematic cross-sectional view showing a conventional chip-type light emitting device 2000. In the chip-type light emitting device 2000, a light emitting element 2010 bonded to a printed wiring substrate 2020 is covered with an encapsulating member 2030 of a low-melting point glass. Lead glass is used for the low-melting point glass. The melting point of lead glass is about 400° C. Melting or hardening lead glass at a temperature of about 400° C. does not affect the properties of the light emitting element 2010. The chip-type light emitting device 2000 is manufactured by bonding the light emitting element 2010 to the predetermined printed wiring substrate 2020. An electrode of the light emitting element 2010 and a wiring base 2021 are wire-bonded using a wire 2090.

The printed wiring substrate 2020 having the light emitting element 2010 bonded thereto is covered with a predetermined metal mold. A hole for injecting an encapsulating member is made in the metal mold. A liquefied low-melting point glass flows into the metal mold from the hole and is then hardened to bond to a material substrate. After bonding, the metal mold is removed, and by cutting to a predetermined size, the chip-type light emitting device 2000 is obtained.

However, when manufacturing the conventional light emitting device 2000, the low-melting point glass is melted into a liquid, so that when the low-melting point glass is hardened, disconnection of wire 2090 or detachment of the light emitting element 2010 from the printed wiring substrate 2020 may occur. This is due to the differences in the expansion coefficients of the printed wiring substrate 2020 and the low-melting point glass that is the encapsulating member 2030 when hardening the low-melting point glass. Moreover, the low-melting point glass has a low light extraction efficiency. This is because the low-melting point glass has a color and a portion of the emitted light from the light emitting element 2010 is absorbed by the colored portion of the low-melting point glass. Further, the low-melting point glass is susceptible to heat and humidity and its chemical stability is low.

SUMMARY OF THE INVENTION

It is, therefore, an object of the present invention to provide a light emitting device having excellent heat resistance and light stability. Another object of the present invention is to provide a simplified manufacturing method with excellent mass productivity for the light emitting device.

After performing various tests to solve the problems described above, the inventor has achieved the present invention.

The present invention relates to a light emitting device comprising a light emitting element having a couple of positive and negative electrodes disposed thereon, a substrate having the light emitting element mounted thereon and the substrate having a substrate electrode, with the electrodes of the light emitting element being electrically connected to the substrate electrode, and a glass covering the light emitting element and having a glass transition temperature (Tg) of from 200° C. to 700° C.

The present invention also relates to a manufacturing method for a light emitting device comprising the steps of mounting a light emitting element having a pair of positive and negative electrodes on a substrate having a substrate electrode, and electrically connecting the electrodes of the light emitting element with the substrate electrode; heating the glass to a temperature from the glass transition temperature or higher to the melting point of the glass or below; pressing the glass against the substrate having the light emitting element mounted thereon; and cooling the glass.

In the present specification, "face-down" depicts a mounting form in which an active device side of a light emitting element or a chip is downwardly connected.

DETAILED DESCRIPTION OF THE PREFERRED EMBODIMENTS

Figure 1:
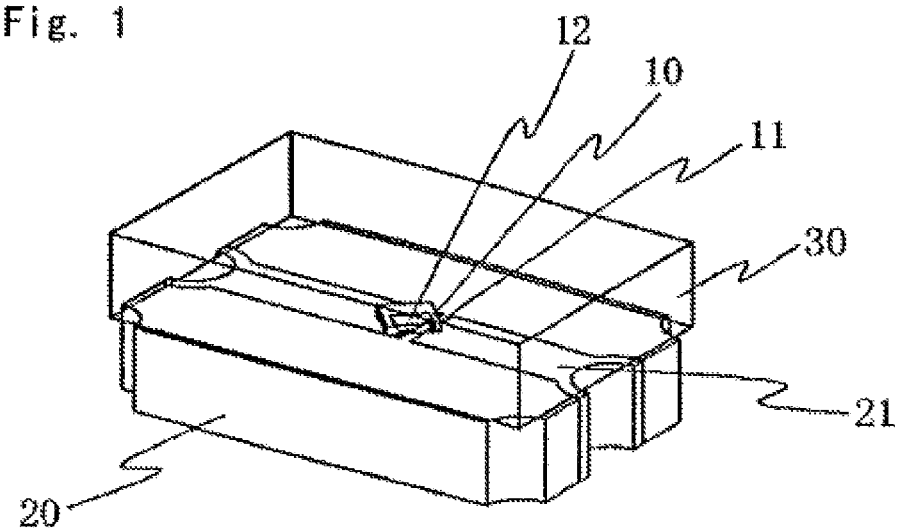
FIG. 1 is a schematic perspective view showing a light emitting device according to a first embodiment.

Preferred embodiments and examples of the light emitting device and the manufacturing method thereof according to the present invention will now be described in detail below. However, the scope of the present invention is not construed to be limited by the disclosed embodiments and examples.

The present invention relates to a light emitting device comprising a light emitting element having a pair of positive and negative electrodes on a common surface side, a substrate whereon the light emitting element is to be mounted, and a substrate electrode disposed on the substrate. The light emitting element is bonded face-down to the substrate electrode. The electrodes of the light emitting element and the substrate electrode are electrically connected. The light emitting element is covered with a glass. Further, a gas intervenes between the light emitting element and the substrate. With this arrangement, a light emitting device having excellent heat resistance and light stability and the like can be provided.

Moreover, because the light emitting element is bonded face-down, problems such as detachment of wires do not occur. Further, light is mainly extracted from the opposite side of the electrodes of the light emitting element, so that light is not blocked by the electrodes.

In the organic materials such as epoxy resin and silicone resin used as the encapsulating member in the conventional light emitting devices, deterioration can occur due to exposure to heat and light for a long time. To counter this effect, glass is used in the present invention, so that deterioration caused by heat or light will be extremely little.

Furthermore, during manufacturing of the conventional light emitting device, a low-melting point glass, which is the encapsulating member, is heated into a liquid and injected, so a gas is not included between the light emitting device and the substrate. In the present invention, a softened glass which is below its melting point is used. Therefore, very little glass will get in between the light emitting element and the substrate, and so a gas intervenes therebetween. Neither a liquid nor a solid substance intervenes between the light emitting element and the substrate. Therefore, when the glass is pressed in order to fix the light emitting element to the substrate, no pressure from the liquid or the solid substance will be applied to the light emitting element. Since the light emitting element is a semiconductor light emitting element, it is very sensitive and it is possible to be severely damaged by a liquid or a solid substance.

The present invention also relates to another light emitting device comprising a light emitting element having a pair of positive and negative electrodes on a common surface side, a substrate whereon the light emitting element is to be mounted, and a substrate electrode disposed on the substrate. The light emitting element is bonded face-down to the substrate electrode. The electrodes of the light emitting element and the substrate electrode are electrically connected via a bump. The light emitting element is covered with a glass. Further, an insulating member is disposed between the light emitting element and the substrate. Because the light emitting element is electrically connected with the substrate electrode, the insulating member is used to prevent short-circuiting. With this arrangement, a light emitting device having excellent heat resistance, light stability, and the like can be provided. Further, by disposing the insulating member between the light emitting element and the substrate, heat dissipation can be improved. This is because heat generated from the light emitting element is transmitted to the insulating member, and is further transmitted to the substrate.

The present invention also relates to another light emitting device comprising a light emitting element having a pair of positive and negative electrodes on a common surface side, a substrate whereon the light emitting element is to be mounted, and a substrate electrode disposed on the substrate. The light emitting element is bonded face-down to the substrate electrode. The electrodes of the light emitting element and the substrate electrode are electrically connected. The light emitting element is covered with a glass, and the glass is pressed to fix it to the substrate. With this arrangement, a light emitting device having excellent heat resistance, light stability, and the like can be provided.

In the conventional light emitting devices, because a low-melting point glass is used during the manufacturing process as the encapsulating member and is heated into a liquid and injected, disconnection of the wires and detachment of the light emitting element have occurred due to differences in the expansion coefficients of the low-melting point glass and the substrate as the glass hardens. However, in the present invention, the glass is pressed when it is in a softened state at a temperature lower than its melting point. Therefore, the differences in the expansion coefficients do not become a problem, and the problems such as detachment of the light emitting element do not arise. Also, the light emitting element is bonded face-down and a wire is not required. Therefore, the problems such as disconnection of the wires do not arise even when the glass is pressed.

The present invention also relates to a light emitting device comprising a light emitting element having a pair of positive and negative electrodes on a common surface side, a substrate whereon the light emitting element is to be mounted, and a substrate electrode disposed on the substrate. The light emitting element is bonded face-down to the substrate electrode. The electrodes of the light emitting element and the substrate electrode are electrically connected. The light emitting element is covered with a glass, and the glass has a glass transition temperature (Tg) of 200° C. to 700° C. With this arrangement, a light emitting device having excellent heat resistance and light stability and the like can be provided.

A low-melting point glass which is the encapsulating member in the conventional light emitting devices has a glass transition temperature of about 100° C. to 150° C. and it softens when a heat of 100° C. to 150° C. or above is applied thereto. When a voltage is applied to the light emitting element, heat is generated and the temperature of the light emitting element may rise to about 120° C. Therefore, in some cases, when a voltage is applied to the light emitting element, the low-melting point glass softens or is predisposed to soften, resulting in a poor heat resistance.

In the present invention, the glass transition temperature is 200° C. or above. Therefore, the glass does not soften and stays in the glass state at the range of temperatures caused by the heat generated from the light emitting element. Thus, a light emitting device having an encapsulating member with excellent heat resistance can be provided.

The present invention also relates to a light emitting device comprising a light emitting element having a pair of positive and negative electrodes on a common surface side, a substrate whereon the light emitting element is to be mounted, and a substrate electrode disposed on the substrate. The light emitting element is bonded face-down to the substrate electrode. The electrodes of the light emitting element and the substrate electrode are electrically connected. Further, the light emitting element is covered with a glass, and the glass has a glass transition temperature (Tg) of 200° C. to 700° C. and a melting point of 220° C. or above. With this arrangement, a light emitting device having excellent heat resistance and light stability and the like can be provided. The glass used in the present invention stays in the softened state without liquefying at temperatures tolerable to the light emitting element, the electrodes, the substrate electrode, the substrate of the light emitting element, and a bump which electrically connects the light emitting element and the substrate, and the like. With this arrangement, problems such as detachment of the light emitting element are prevented. Moreover, destruction of the light emitting element and the bump is prevented.

Lead-free glass has a glass transition temperature of 200° C. to 700° C., and a melting point of at least 220° C. Lead glass has a glass transition temperature of 300° C. to 700° C., and a melting point of at least 410° C.

A low-melting point glass containing lead and used as the encapsulating member in the conventional light emitting devices has a melting point of 400° C. or less and liquefies when heated to at least 400° C. As a result, problems such as disconnection of the wires and the like arise in conventional light emitting devices. However, even when the glass used in the present invention is heated to over 400° C., it does not liquefy and in some cases, it softens. Therefore, the problems such as detachment of the light emitting element are not caused.

The present invention also relates to a light emitting device comprising a light emitting element having a pair of positive and negative electrodes on a common surface side, a substrate whereon the light emitting element is to be mounted, and a substrate electrode disposed on the substrate. The light emitting element is bonded face-down to the substrate electrode. The electrodes of the light emitting element and the substrate electrode are electrically connected. The light emitting element is covered with a glass, and a side surface of the glass is polished or cut. With this arrangement, a light emitting device having excellent heat resistance and light stability and the like can be provided.

Both of the organic materials such as an epoxy resin and the low-melting point glass which are the encapsulating members in the conventional light emitting devices are in liquid form at the time of molding. Therefore, a means of dropping the organic material or the low-melting point glass onto the light emitting element and hardening it by using surface tension is adopted. An alternative means includes pouring the organic material or the low-melting point glass into a predetermined metal mold, putting the light emitting element therein and hardening it. Neither means requires polishing or cutting.

In the present invention, a predetermined glass plate and the like is heated to its softened state and is fixed onto the substrate whereon a plurality of light emitting elements have been mounted. Therefore, a cutting step so as to separate each light emitting element is required. Also, the light extracting efficiency can be improved by polishing. Further, by polishing or by cutting, light can be extracted in a predetermined direction using the differences in the refractive indices of the glass and the air.

The present invention also relates to a light emitting device comprising a light emitting element having a pair of positive and negative electrodes on a common surface side, a substrate whereon the light emitting element is to be mounted, and a substrate electrode disposed on the substrate. The light emitting element is bonded face-down to the substrate electrode. The electrodes of the light emitting element and the substrate electrode are electrically connected. The light emitting element is covered with a glass, and an upper surface of the glass is polished. With this arrangement, a light emitting device having excellent heat resistance and light stability and the like can be provided.

A predetermined glass plate and the like is heated to its softened state and is fixed onto the substrate whereon a plurality of light emitting elements have been mounted. Because the glass is planar, polishing can be carried out with ease, so that the light emitting devices can be provided with minimal differences between the products. Moreover, even in a case where a little irregularity occurred on the surface of the glass, by polishing, the light emitting device having a predetermined orientation characteristic can be provided. Also, the light extraction efficiency can be improved by polishing. Further, by polishing or by cutting, light can be extracted in a predetermined direction using the difference in the refractive indices between the glass and the air. Further, because the light emitting element is mounted face-down, by polishing the substrate of the light emitting element and the surface of the glass approximately in parallel, light can also be extracted in a predetermined direction.

The substrate is preferably a ceramic. With this arrangement, a light emitting device having excellent heat resistance and light stability and the like can be provided, and further, the manufacturing step of pressing the glass can be endured by the light emitting element.

It is preferable that a recess defined by a bottom surface and a side surface is formed in the substrate and the substrate electrode is disposed in the bottom surface of the recess. The side surface of the recess preferably has a shape of a reversed truncated cone widening towards the opening. With this arrangement, light from the light emitting element irradiating the side surface of the recess is reflected from it and emitted to outside. Also, light from the light emitting element irradiating the substrate electrode disposed in the bottom surface of the recess is reflected from it and emitted to the outside. With this arrangement, the frontal luminous intensity can be improved.

A lenticular glass may be used as the above-described glass. With this arrangement, the light emitting device having a predetermined distribution of light can be provided.

The glass preferably contains 100 ppm or less, or substantially no lead. With this arrangement, the substance that has a harmful effect on the environment can be excluded. However, because lead glass has a beautiful glaze and sheen, a lead glass may also be used in the light emitting device of the present invention.

The glass may contain at least one material selected from the group consisting of a fluorescent material, a pigment, a filler, a light diffusing member, and a ceramic powder. With this arrangement, the light emitting device complying with intended application can be provided. For example, by using a blue-light emitting light emitting element and a glass containing a yellow-emitting fluorescent material, a light emitting device which emits white light can be provided. Also, by using a light diffusing member, a light emitting device capable of emitting uniform light with little irregularity in color can be provided.

The light emitting element may also be covered with a covering member and the covering member may be covered with a glass. The light emitting element may be directly covered with a glass. Additionally, the light emitting element may be covered with a covering member and then the covering member may be covered with a glass. With this arrangement, the light emitting element can be protected from heat and dust and the like.

The covering member may contain at least one material selected from the group consisting of a fluorescent material, a pigment, a filler, a light diffusing member, and a ceramics powder. With this arrangement, the light emitting device complying with intended application can be provided. It is cost-effective because the fluorescent material and the like can be disposed in the vicinity of the light emitting element so that the amount of the fluorescent material used can be reduced. Also, the covering member can be made into liquid or molten state, so that the dispersibility of the materials can be improved.

In the light emitting device, a protective element may be disposed on the substrate. With this arrangement, damage to the light emitting element caused by a reverse current can be prevented.

In the light emitting device, it is preferable that a protective element is disposed on the side opposite to the side whereon the light emitting element is mounted. With this arrangement, even a protective element using a wire can be used.

It is preferable that a coating is further provided to the glass. With this arrangement, discoloration of the glass can be reduced. Also, a predetermined function can be added. Examples of such a coating include a coating having a filter effect of absorbing light of a predetermined wavelength and discharging light of a specific wavelength.

The present invention also relates to a manufacturing method of a light emitting device which comprises a light emitting element having a pair of positive and negative electrodes disposed on the same plane side, a substrate whereon the light emitting element is to be mounted, a substrate electrode mounted on the substrate, and a glass by which the light emitting element is covered.

The manufacturing method comprises four manufacturing steps. In a first step, the light emitting element is bonded with flip-chip mounting. That is, the light emitting element is bonded face-down on the substrate electrode and the electrodes of the light emitting element and the substrate electrode are electrically connected. In a second step, the glass is heated to a temperature of the glass transition temperature which is below the melting point of the glass. In a third step, the glass is pressed against the substrate on which the light emitting element has been mounted. In a fourth step, the glass is cooled.

The pressure applied to the glass can be endured by mounting the light emitting element and the substrate electrode using a bump and the like, by way of flip-chip mounting. Also, because a wire is not used, disconnection need not be considered. Further, light emitted from the light emitting element is not intercepted by the electrode attached to the light emitting element. Also, by heating the glass to a temperature higher than the glass transition temperature, the glass achieves its softened state so that fixation of the glass and the substrate can be carried out easily. Moreover, because the glass is kept at a temperature lower than its melting point and the glass does not liquefy, so that fixation of the glass and the substrate can be carried out easily without considering the expansion coefficient of the glass.

The manufacturing method of the light emitting device may further include a fifth step in which the side surface of the glass is cut or polished, or the upper surface of the glass is polished. Cutting of the side surface of the glass may be carried out by cutting the glass and the substrate using a dicing operation and the like. Cutting by the dicing operation can also be carried out only on the glass. After making an incision using the dicing operation only on the glass, the glass and/or the substrate may be divided further by applying stress. The glass and/or the substrate may also be divided by applying stress after making an incision using the dicing operation and the like to both the glass and the substrate. The glass and/or the substrate may also be divided by applying stress after using a dicing operation on the substrate. Thus, the glass and/or the substrate can be divided easily according to these methods. The surfaces that occur by dividing them can also be made smooth.

It is preferable that in the second step, the glass is heated to a temperature from 200° C. to 800° C. Especially, it is preferable that lead-free glass is heated to a temperature from 200° C. to 800° C., and lead glass is heated to a temperature from 300° C. to 800° C. It is further more preferable that lead-free glass is heated to a temperature from 300° C. to 800° C., and lead glass is heated to the temperature from 410° C. to 800° C. That is, heating to these temperatures, the properties of the light emitting element, the electrodes of the light emitting element, the substrate electrode, the bump and the like can be maintained and the glass can be fixed to the substrate. With this arrangement, a light emitting device having excellent heat resistance and light stability can be provided.

In the third step, a mold with a predetermined shape may be brought in contact with the glass and pressure can be applied to the mold. With this arrangement, shaping of the glass can be easily carried out.

The present invention also relates to a light emitting device comprising a light emitting element having a pair of positive and negative electrodes, a substrate whereon the light emitting element is to be mounted, a substrate electrode is disposed on the substrate, and a wire is electrically connected to the electrode and the substrate electrode. Further, the light emitting element is covered with a glass, and the glass has a glass transition temperature (Tg) of 200° C. to 700° C. and a melting point of 220° C. or above. Lead-free glass has a glass transition temperature of 200° C. to 700° C. and a lead glass has a glass transition temperature of 300° C. to 700° C. Lead-free glass has a melting point of at least 220° C., and preferably less than or equal to 800° C. Lead glass has the melting point of at least 410° C., and preferably less than or equal to 800° C. By changing the quality of the glass, even in a case where a wire is used, the glass can be fixed by applying a pressure without an occurrence of a disconnection of the wire.

The present invention also relates to a light emitting device comprising a light emitting element having a pair of positive and negative electrodes, a substrate whereon the light emitting element is be mounted, a substrate electrode is disposed on the substrate, and a wire is electrically connected to at least one of the pair of the positive and negative electrodes and the substrate electrode. Further, the light emitting element is covered with a glass and the glass is fixed to the substrate by applying pressure. By changing the quality of the glass, even when pressure is applied to the glass, the glass can be fixed without an occurrence of a disconnection of the wire.

The present invention also relates to a manufacturing method of a light emitting device which comprises a light emitting element having a pair of positive and negative electrodes, a substrate whereon the light emitting element is to be mounted, a substrate electrode is mounted on the substrate, a wire is electrically connected to the substrate electrode and the electrodes of the light emitting element, and a glass by which the light emitting element is covered. The manufacturing method comprises four manufacturing steps. In a first step of mounting the light emitting element, the light emitting element is bonded on the substrate and the electrodes of the light emitting element and the substrate electrode are electrically connected via the wires. In a second step, the glass is heated to a temperature from the glass transition temperature to below the melting point of the glass. In a third step, the glass is pressed against the substrate on which the light emitting element has been mounted. In a fourth step, the glass is cooled. Thus, by heating the glass to a temperature from the glass transition temperature to below the melting point of the glass, the glass can be fixed to the substrate without an occurrence of a disconnection of the wires.

As described above, the substrate 20 and the glass 30 can be formed with an inorganic material, so that a light emitting device having extremely excellent heat resistance and light stability can be provided.

First Embodiment

Light Emitting Device

Figure 2:
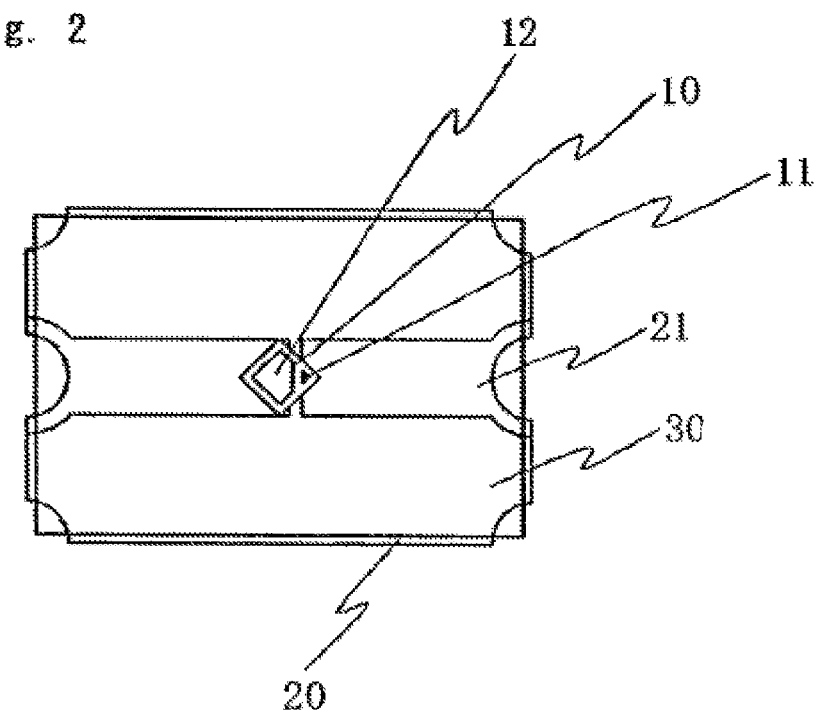
FIG. 2 is a schematic plan view showing the light emitting device according to the first embodiment.
Figure 3:
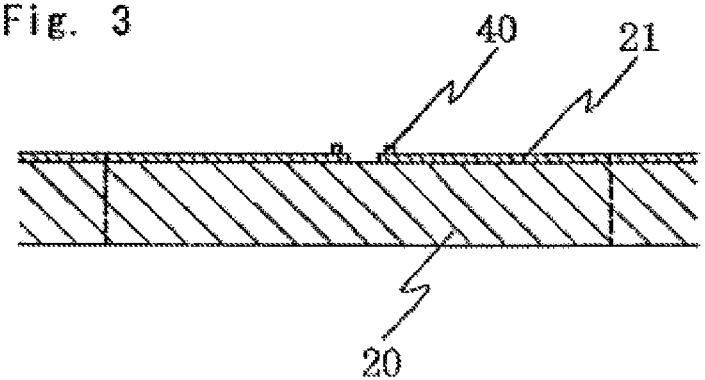
FIG. 3 is a schematic cross-sectional view (1) showing a manufacturing method of the light emitting device according to the first embodiment.
Figure 4:
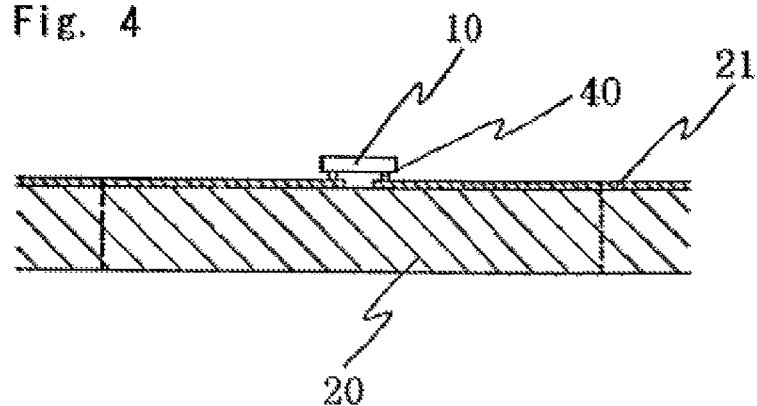
FIG. 4 is a schematic cross-sectional view (2) showing the manufacturing method of the light emitting device according to the first embodiment.
Figure 5:
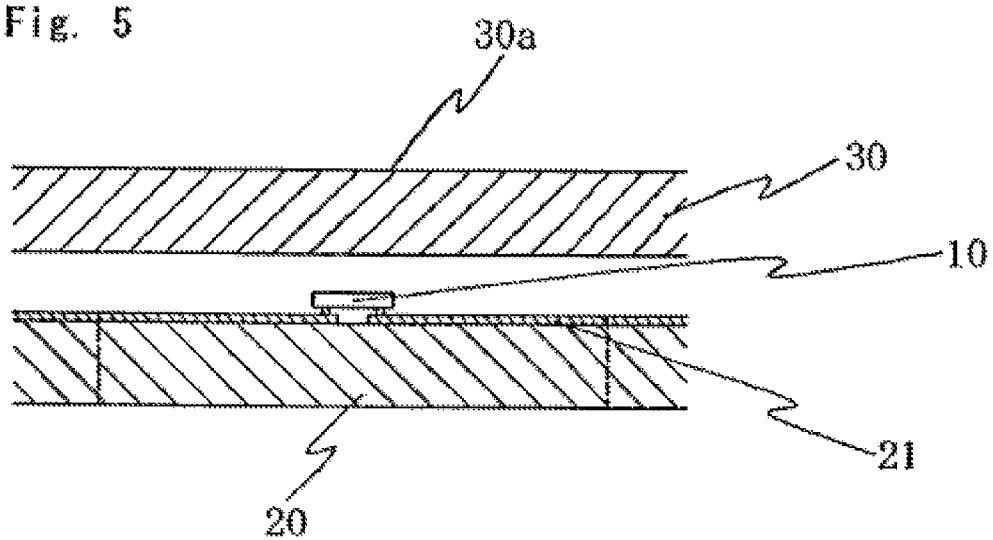
FIG. 5 is a schematic cross-sectional view (3) showing the manufacturing method of the light emitting device according to the first embodiment.
Figure 6:
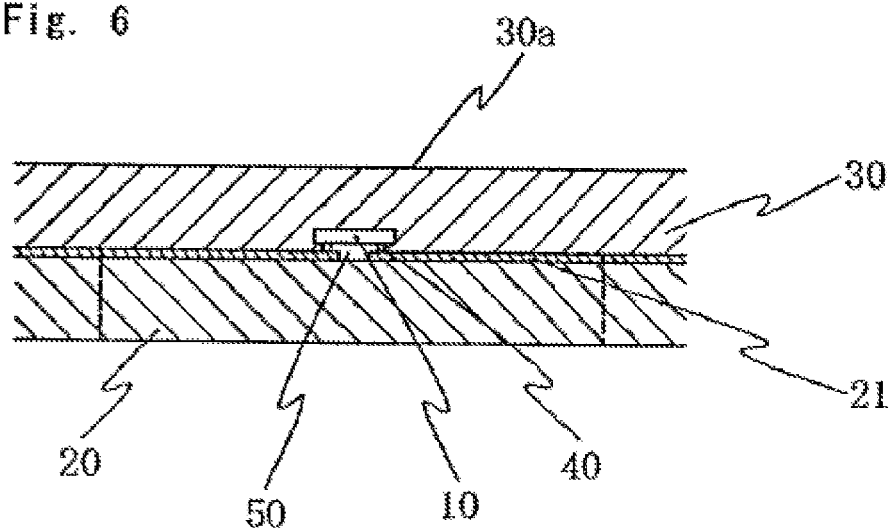
FIG. 6 is a schematic cross-sectional view (4) showing the manufacturing method of the light emitting device according to the first embodiment.
Figure 7:
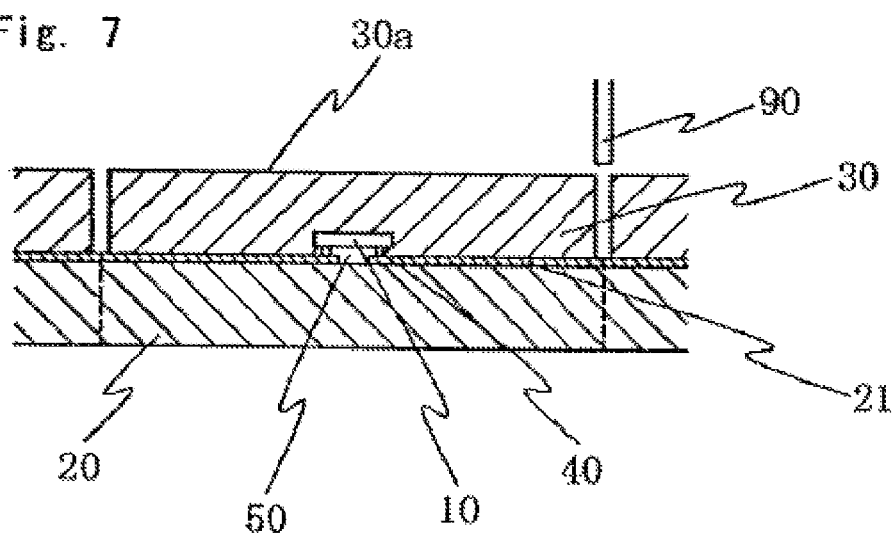
FIG. 7 is a schematic cross-sectional view (5) showing the manufacturing method of the light emitting device according to the first embodiment.
Figure 8:
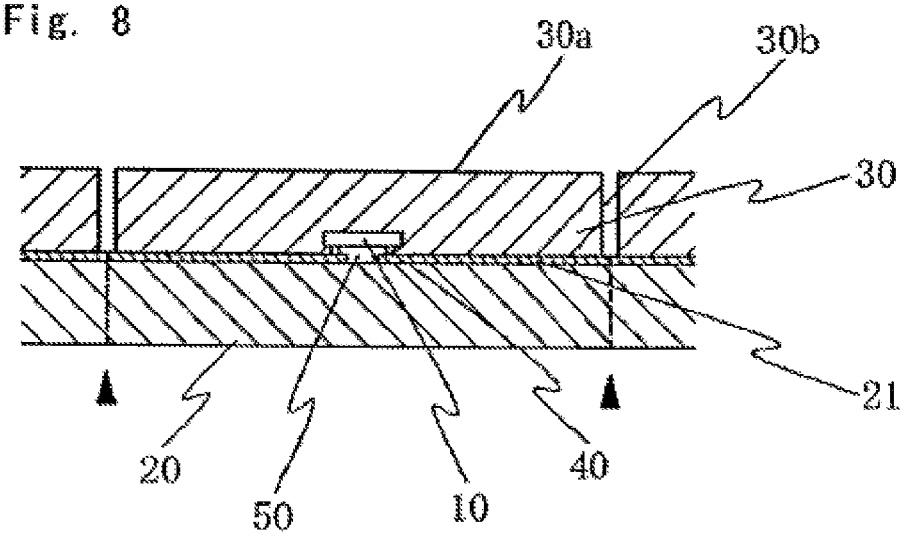
FIG. 8 is a schematic cross-sectional view (6) showing the manufacturing method of the light emitting device according to the first embodiment.
Figure 9:
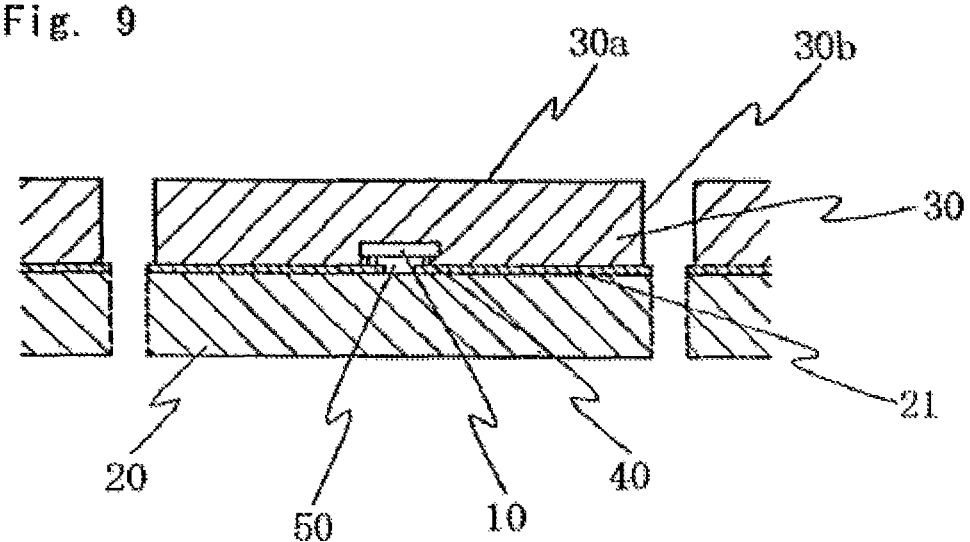
FIG. 9 is a schematic cross-sectional view (7) showing the manufacturing method of the light emitting device according to the first embodiment.

A light emitting device according to the first embodiment will be described below with reference to the accompanying drawings. FIG. 1 shows a schematic perspective view of a light emitting device according to the first embodiment. FIG. 2 shows a schematic plan view of a light emitting device according to the first embodiment.

The light emitting device according to the first embodiment mainly comprises a light emitting element 10, a substrate 20, a substrate electrode 21, and a glass 30. The light emitting element 10 has an n-side electrode 11 and a p-side electrode 12 on the same side. The substrate 20 has a predetermined shape and a substrate electrode 21 having a predetermined wiring pattern is disposed on the upper surface of the substrate electrode 21. The light emitting element 10 is mounted face-down on the substrate electrode 21 disposed on the substrate 20. The n-side electrode 11 and the p-side electrode 12 are electrically connected to the respective substrate electrodes via the bumps. The light emitting element 10 is directly covered with a glass 30. The glass 30 is fixed to the substrate 20 by pressing. The side surfaces of the glass 30 are polished or cut. When the side surfaces of the glass 30 which have been cut by a cutter and are rough, or when the glass 30 is processed to a predetermined size, it is preferable to polish the cut surfaces. Moreover, the upper surface of the glass 30 is also polished. However, when the upper surface of the glass 30 is flat and does not have an adhered object, polishing is not necessary. The glass 30 may also contain a fluorescent material, a pigment, a filler, a light diffusing member, a ceramics powder and the like.

The light emitting device will be described in detail below.
<Light Emitting Element>

The light emitting element 10 used herein comprises a semiconductor layer of GaAlN, ZnS, ZnSe, SiC, GaP, GaAlAs, AlN, InN, AlInGaP, InGaN, GaN, AlInGaN, and the like formed on the substrate as the light emitting layer. The structure of the semiconductor may be a homostructure, heterostructure, or double heterostructure which have an MIS junction, PIN junction, or P-N junction. From ultraviolet light to infrared light, various wavelengths of emission can be selected according to the materials and the mixed crystal ratio of the semiconductor layer. Also, the active layer can be of a single well structure or a multiple well structure, formed as a thin layer wherein a quantum effect can occur.

In the light emitting device for outdoor usage, it is preferable to use a gallium nitride compound semiconductor as a semiconductor material that can form a light emitting element with high luminance, and for red emission, it is preferable to use a gallium.aluminum.arsenic semiconductor and a aluminum.indium.gallim.phosphorus semiconductor. However, various semiconductors can also be used according to the particular application.

When a gallium nitride compound semiconductor is used, a material such as sapphire, spinal, SiC, Si, ZnO, or GaN and the like may be used as the substrate. It is preferable to use a sapphire substrate in order to form a gallium nitride having a good crystallinity with good mass productivity. The light emitting element 10 is used face-down, so that the substrate is required to be light-transmissive. The light emitting element 10 using a nitride compound semiconductor is shown below. A buffer layer of GaN, AlN, and the like is formed on the sapphire substrate. A first contact layer of n-type or p-type GaN, an active layer of InGaN thin layer with a quantum effect, a cladding layer of p-type or n-type AlGaN, and a second contact layer of p-type or n-type GaN may be formed sequentially on the sapphire substrate. The gallium nitride compound semiconductor shows an n-type conductivity under conditions where no impurities have been doped. In order to form an n-type gallium nitride semiconductor having a desired property such as improved light emission efficiency, it is preferable to arbitrarily introduce an n-type dopant such as Si, Ge, Se, Te, and C.

On the other hand, in order to form a p-type gallium nitride semiconductor, a p-type dopant such as Zn, Mg, Be, Ca, Sr, Ba, and the like can be introduced. Due to the fact that the gallium nitride semiconductor is not easily converted to the p-type solely by doping a p-type dopant, it is necessary to carry out an annealing step by way of heating in a furnace, low electron irradiation, plasma exposure, in order to convert it to the p-type. A partial etching and the like may be carried out to the semiconductor wafer formed in this manner and each positive and negative electrode is then formed. Afterwards, the light emitting element 10 can be formed by cutting the semiconductor wafer into the desired size.

It is preferable that the semiconductor light emitting element 10 is adjusted so that the sheet resistance Rn of the n-type contact layer formed with an impurity concentration of $10^{17}$ to $10^{20}/cm^3$ and the sheet resistance Rp of the light-transmissive p-electrode is Rp≧Rn. It is preferable that the n-type contact layer is formed with a thickness of, for example, 3 to 10 μm, and more preferably 4 to 6 μm. Since the sheet resistance in this range of thickness is estimated to be 10 to 15Ω/□, it is preferable to form the light-transmissive p-electrode as a thin layer so that Rp has a sheet resistance value larger than that described above. The light-transmissive p-electrode may also be formed as a thin layer with a thickness of 150 μm or less. Moreover, other than the metal, ITO (indium tin oxide) and ZnO can be used for the p-electrode. Here, instead of the light-transmissive p-electrode, the electrode may have a construction with a plurality of openings for extracting light, such as a mesh electrode.

Moreover, when the light-transmissive p-electrode is formed as a multilayer or an alloy comprising an element selected from the group consisting of gold and a platinum group metal and at least one other element, by adjusting the sheet resistance of the light-transmissive p-electrode with the content of gold or the platinum group element, the stability and the reproducibility can be improved. The absorption coefficients in the wavelength range of the semiconductor light emitting element of gold and a metallic element are high. Therefore, the lower the amount of gold or platinum group metal included in the light-transmissive p-electrode, the better the transmittance will be that can be obtained.

In the semiconductor light emitting element, it is preferable that the sheet resistance Rn Ω/□ of the n-type contact layer and the sheet resistance Rp Ω/□ of the light-transmissive p-electrode is such that Rp≧Rn. It is difficult to measure Rn after the semiconductor light emitting element is formed. Therefore, it is substantially impossible to determine the exact relation between Rp and Rn; however, it is possible to know the general relation between Rp and Rn from the light intensity distribution when it is emitting light.

When the relation between the light-transmissive p-side electrode 12 and the n-type contact layer is Rp≧Rn in the light emitting element 10, the external quantum efficiency can be further improved by disposing a p-side seat electrode which has an extended conductive portion and is in contact with the light-transmissive p-electrode. The shape and the direction of the extended conductive portion are not limited, and it is preferable that when the extended conductive portion is located on the satellite line, the area obstructing the light-transmission can be reduced. However, a mesh-shape can also be used. Other than a linear shape, the shape of the extended conductive portion may also be a curved line, a grid, a branched shape, or a hook-like shape. The light blocking effect increases in proportion to the total area of the p-side seat electrode. Therefore, it is preferable to design the width and length of the extended conductive portion so that the light blocking effect does not exceed the emission enhancing effect.

A plurality of the light emitting elements 10 can be used and a variety of colors can be obtained by combinations thereof. For example, the light emitting elements 10 capable of emitting a blue, a green, and a red light respectively are used to obtain three primary colors. In order to use as a full-color light emitting device for a display article, it is preferable that the red emission wavelength is 610 to 700 nm, the green emission wavelength is 495 to 565 nm, and the blue emission wavelength is 430 to 490 nm. For the white light emitting device, a blue light emitting element 10 and a fluorescent material which emits yellow light may be used. The fluorescent material absorbs light emitted from the light emitting element 10 and converts that wavelength and then emits yellow light. The light emitted from the fluorescent material and the light emitted from the light emitting element 10 are mixed to form a mixed light so that white light is emitted. The arrangement of the plurality of the light emitting elements 10 may be arbitrarily changed according to the usage, manufacturing steps, and the like.

The light emitting element 10 has the n-side electrode 11 and the p-side electrode 12 on the same planar side. The p-side electrode 12 may have a linear shape, a curved shape, a hook-like shape, a comb-like shape, a mesh shape and the like. A metal such as Au and Au—Sn, a nonmetal such as ITO and ZnO and the like can also be used for the p-side electrode 12. Also, instead of the light-transmissive p-side electrode 12, an electrode shape having a plurality of openings for extracting light, such as a mesh electrode, can be used.

As for the size of the light emitting element 10, 1 mm×1 mm is implementable, and 600 μm×600 μm, 320 μm×320 μm and the like can also be implemented.

<Substrate>

The substrate 20 has the substrate electrode 21 having a predetermined pattern. The electrodes of the light emitting element 10 are electrically connected with the substrate electrode 21 and the light emitting element 10 is mounted on the substrate 20. The light emitting element 10 is mounted face-down. The substrate 20 only has to be a material that does not change in quality at a temperature that softens the glass 30. Examples of such a substrate include, a ceramic substrate, a GaN substrate, a glass substrate, an epoxy substrate, a metallic substrate, and a glass substrate and the like. Among those, a ceramic substrate is especially preferable, because ceramics have excellent thermal resistance and light stability.

The substrate 20 made of ceramics is planar with a predetermined thickness. In the substrate 20, a through-hole may be made at a predetermined position in the flat plate and a conductive member may be disposed in the through-hole. The substrate 20 is approximately hexahedron and the through-holes are made from the upper surface to the rear surface at each of the four corners. Further, through-holes are made at each of the two opposite sides and the conductive member is disposed from the upper surface to the rear surface of the substrate 20. A predetermined pattern is formed on the upper surface of the substrate 20 and is electrically connected with the conductive member in the through-holes. Moreover, a conductive member is disposed on a large area of the rear surface of the substrate 20 to such an extent so as not to cause a short-circuit, and it is electrically connected with the conductive member in the through-holes. The conductive members described above form the substrate electrode 21. With this arrangement, an electrical connection can be established at the rear surface of the substrate 20.

The substrate electrode 21 disposed on the substrate 20 is at least a couple of conductive members electrically connecting the n-side electrode 11 to the p-side electrode 12 of the light emitting element 10. For the wiring pattern of the substrate electrode 21, it is preferable to use a member having an electric conductivity and reflection efficiency as high as the metals such as gold, silver, copper, nickel, and aluminum, or ITO. The purpose is to reflect light from the light emitting element 10 by the substrate electrode 21 and to improve the frontward luminous efficiency. The material of the substrate electrode 21 is preferably selected according to the emission wavelength of the light emitting element 10. This is because in some cases, the reflective index may be high in one wavelength range and may be low in a different wavelength range. The substrate electrode 21 may cover a large area of the upper surface of the substrate 20, but it is preferable that the substrate electrode 21 covers less than a half of the area of the upper surface of the substrate 20 so as to improve the fixing strength of the glass 30 with the substrate 20 and to insulate the wiring pattern.

For example, the substrate 20 using ceramics is prepared by forming a predetermined shape and sintering it. One or a plurality of ceramic greensheets can be used for the substrate 20. The substrate 20 can take various shapes at the stage of the greensheet before baking. The wiring pattern in the ceramic substrate 20 is formed with a raw material of a paste in which at least one high melting point metal such as tungsten and molybdenum is contained in a resin binder. By using a screen printing technique and the like, a desired shape is formed via the through-holes made in the greensheet which is in paste form, and by baking of the ceramics, a wiring pattern of the conductor can be formed. Such greensheets are stacked and sintered to make the ceramic substrate 20.

The ceramic material used for the substrate 20 is preferably $Al_2O_3$, AlN, SiC, $SiO_2$, $ZrO_2$, SiN, and the like. Specific examples of the ceramics include a ceramic in which 90 weight % to 96 weight % of the raw powder material is alumina and 4 weight % to 10 weight % of the sintering subsidiary material of clay, talc, magnesia, calcia, and silica and the like is added. These are sintered at the temperature within a range from 1500° C. to 1700° C. Alternatively, a ceramic in which 40 weight % to 60 weight % of the raw powder material is alumina and 60 weight % to 40 weight % of the sintering subsidiary material of borosilicate glass, cordierite, forsterite, mullite, and the like is added can be used. These are sintered at the temperature within a range from 800° C. to 1200° C. $TiO_2$, TiN and the like can be added into such a ceramic material. Also, a dark color can be obtained by including $Cr_2O_3$, $MnO_2$, $Fe_2O_3$, and the like into the greensheet.

The thickness of the substrate 20 is preferably from 0.3 mm to 3 mm, however, the substrate with an arbitrary thickness can also be used. The substrate 20 with a planar surface of an approximately rectangular, approximately square, and an approximately polygonal and the like can be used. The substrate 20 can be manufactured with a planar size of 2 mm to 5 mm in the long side and 1 mm to 3 mm in the narrow side. Therefore, a substrate having a predetermined size can also be manufactured.

<Substrate Electrode>

The substrate electrode 21 is disposed on the substrate 20 to establish electrical connection with the external electrodes. Also, the n-side electrode 11 and the p-side electrode 12 are electrically connected to the substrate electrode 21. The substrate electrode 21 also has a pair of electrodes including an anode and a cathode. Hereinafter, the description is made by referring the cathode electrode, however, the anode electrode also has the shape in the same manner as the cathode electrode.

It is preferable that in the direction parallel to the surface whereon the light emitting element 10 is mounted, the cross-sectional shape of the cathode electrode at the side surface side of the substrate 20 approximately fits the shape of the external electrode establishing the electric connection with the cathode electrode. For example, it is preferable that the cross-sectional shape of the substrate electrode 21 at the side surface of the substrate 20 has a C-shape with a flat portion.

The substrate electrode 21 may be formed by using a high heat conduction material such as copper including iron. Also, the surface of the substrate electrode 21 may be metal plated with silver, aluminum, nickel, copper, gold, and the like. It is preferable to make the surface of the substrate electrode 21 smooth to improve its reflectivity. However, irregularity may be made in the surface of the substrate 20 so as to improve the adhesiveness of the substrate 20 with the glass 30.

<Bump>

The n-side electrode 11 and the p-side electrode 12 of the light emitting element 10 are electrically connected to the substrate electrode 21 through bumps. The material of the bump is conductive. Moreover, a metal of the bump and the like that does not soften to cause short-circuiting when the glass 30 is heated so as to soften, is used. For example, in some cases, a metal or an alloy such as Au—Sn, Ag, Cu, Pb and the like can be used, however, Au is preferable. The melting point of Au is 1064° C. A gold bump does not soften at the temperature that the glass 30 softens, so that it does not cause a short-circuit between the light emitting element 10 and the substrate electrode 21. A bump is generally ball-shaped and having a diameter of 100 to 300 μm.

<Glass>

The glass 30 transmits light from the light emitting element 10 and protects the light emitting element 10 from moisture and dust, etc. The glass 30 directly covers the light emitting element 10. The glass 30 is fixed to the substrate 20 by being pressed. The glass 30 is fixed to the ceramic substrate 20. This is because the fixing power between the glass 30 and ceramics is greater than the fixing power between the glass 30 and a metal. The glass 30 is planar and has a predetermined thickness. The state of the side surface of the glass 30 cut with a cutting instrument is acceptable. The whole glass 30 has been cut with a saw cutting instrument. Alternatively, it is also an acceptable state that is made by scratching a portion of the glass 30 and applying stress along the scratch to divide the glass. Further, after this cutting or dividing, the side surface of the glass 30 can be polished. The glass 30 can be used without polishing its upper surface in some cases, and the glass 30 can also be used after polishing its upper surface to eliminate any roughness. When the glass 30 is cut with a cutting instrument, the size of the glass is slightly smaller than that of the substrate 20, however, when the glass 30 is scratched and divided, the size of the glass can be made approximately the same as the size of the substrate 20.

The glass 30 is heated to a temperature from the glass transition temperature to below the melting point of the glass, at which the glass shows its softened state. When the glass 30 softens, the glass 30 and the substrate 20 are pressed, and the light emitting element 10 is embedded into the glass 30. The glass 30 then hardens by cooling and is fixed to the substrate 20.

Lead-free glass 30 has a glass transition temperature of 200° C. to 700° C. It is preferable that lead-free glass 30 has a melting point from 220° C. to 800° C. On the contrary, lead glass 30 has a glass transition temperature of 300° C. to 700°

C. It is preferable that lead glass 30 has a melting point from 410° C. to 800° C. With this arrangement, by heating the glass 30 to a temperature from the glass transition temperature to below the melting point of the glass so as to soften, the glass 30 can be fixed to the substrate 20. Especially, the glass 30 preferably has a glass transition temperature of 430° C. to 600° C. This is provided that the softened state is not the liquified state which has been heated more than the melting point. The material of the glass 30 may be $SiO_2$ (silica), $B_2O_3$ (diboron trioxide), ZnO (zinc oxide), $TiO_2$ (titanium oxide (IV)).

Other than those materials, an oxide such as PbO, $Ga_2O_3$, CdO, BaO, $Al_2O_3$, $La_2O_3$, $TaO_5$, $Li_2O$, $ZrO_2$, $WO_3$, $Nb_2O_5$, $P_2O_5$, $Na_2O$, $K_2O$, CaO, BaO, and MgO and a fluoride such as LiF, NaF, KF, $AlF_3$, $MgF_2$, $CaF_2$, $SrF_2$, $BaF_2$, $YF_3$, $LaF_3$, $SnF_2$, and $ZnF_2$ may be included. With this arrangement, the melting point, the glass transition temperature, the refractive index, and the like can be adjusted to the predetermined values.

By adjusting the refractive index to a predetermined value, the light extraction efficiency of light emission from the light emitting element 10 can be improved. It is also possible to increase the luster and to improve the transparency by incorporating Pb. By incorporating Pb, separation of the metallic mold and the glass 30 in the manufacturing steps can be easily carried out. However, it is preferable that the content of Pb in the glass 30 be 100 ppm or less, and it is especially preferable that substantially no Pb be included, in view of protection of the environment.

Other than a planar glass, a plate glass having a recess and a protrusion, individually divided pieces of glass, and the like, can be used as the glass 30 before cutting. For example, the light emitting element 10 is mounted face-down in the recess of the substrate 20, and the individually divided pieces of glass 30 are placed in the recess. The glass 30 is then heated to the predetermined temperature and the softened glass fills the recess. Also, by using a predetermined metallic mold, a lenticular glass 30 can be formed. Similarly, the light emitting element 10 is mounted face-down in the recess of the substrate 20 and a planar glass 30 having a recess and a protrusion is placed so that the protrusion of the glass is inserted in the recess of the substrate. The glass 30 is then heated to the predetermined temperature and the softened glass 30 fills the recess. A thin portion of glass 30 is placed over the recess and the upper surface of the substrate 20. Also, by using a predetermined metallic mold, a lenticular glass 30 can be formed.

<Fluorescent Material>

A fluorescent material, or a phopsphor may also be incorporated in the glass 30. By including the fluorescent material, the light emitted from the light emitting element 10 is absorbed by the fluorescent material and after the wavelength conversion, light with a different color than the light from the light emitting element 10 can be emitted. Therefore, the fluorescent material is only required to be able to absorb the light emitted from the light emitting element 10 and to convert to the light into a different wavelength. For example, it is preferable to include at least one material selected from the list below. A nitride-based phosphor• an oxynitride-based phosphor activated mainly with a lanthanoide such as Eu and Ce: an alkaline earth halogenapatite phosphor, an alkaline earth metal borate halogen phosphor, an alkaline earth metal aluminate phosphor, an alkaline earth silicate, an alkaline earth sulfide, an alkaline earth thiogallate, an alkaline earth silicon nitride, and a germanate, activated mainly with a lanthanoide such as Eu, or with a transition metal such as Mn, or a rare earth aluminate and a rare earth silicate activated mainly with a lanthanoide such as Ce, and an organic compound or organic complexes activated mainly with a lanthanoide such as Eu. As specific examples, the phosphors described below can be used, but other fluorescent materials can also be used.

Examples of the nitride-based phosphor which is mainly activated with a lanthanoide such as Eu and Ce include $M_2Si_5N_8$:Eu (wherein M represents at least one material selected from Sr, Ca, Ba, Mg, and Zn). Other than $M_2Si_5N_8$:Eu, the examples include $MSi_7N_{10}$: Eu, $M_{1.8}Si_5O_{0.2}N_8$:Eu, $M_{0.9}Si_7O_{0.1}N_{10}$:Eu (wherein M represents at least one material selected from Sr, Ca, Ba, Mg, and Zn).

Examples of the oxynitride-based phosphor which is mainly activated with a lanthanoide such as Eu and Ce include $MSi_2O_2N_2$:Eu (wherein M represents at least one material selected from Sr, Ca, Ba, Mg, and Zn).

Examples of the alkaline earth halogenapatite phosphor which is mainly activated with a lanthanoide such as Eu and Ce or a transition metal such as Mn include $M_5(PO_4)_3X$:R (wherein M represents at least one material selected from Sr, Ca, Ba, Mg, and Zn; X represents at least one material selected from F, Cl, Br, and I; and R represents at least one material selected from Eu and Mn).

Examples of the alkaline earth metal borate halogen phosphor include $M_2B_5O_9X$:R (wherein M represents at least one material selected from Sr, Ca, Ba, Mg, and Zn; X represents at least one material selected from F, Cl, Br, and I; and R represents at least one material selected from Eu and Mn).

Examples of the alkaline earth metal aluminate phosphor include $SrAl_2O_4$:R, $Sr_4Al_{14}O_{25}$: R, $CaAl_2O_4$: R, $BaMg_2Al_{16}O_{27}$: R, $BaMg_2Al_{16}O_{12}$:R, $BaMgAl_{10}O_{17}$:R (wherein R represents at least one material selected from Eu and Mn).

Examples of the alkaline earth sulfide phosphor include $La_2O_2S$:Eu, $Y_2O_2S$:Eu, and $Gd_2O_2S$:Eu.

Examples of the rare earth aluminate phosphor which is mainly activated with a lanthanoide such as Ce include the YAG phosphors represented by the composition formula such as $Y_3Al_5O_{12}$: Ce, $(Y_{0.8}Gd_{0.2})_3Al_5O_{12}$:Ce, $Y_3(Al_{0.8}Ga_{0.2})_5O_{12}$: Ce, and $(Y,Gd)_3(Al,Ga)_5O_{12}$, and the phosphors in which Y is partially or entirely substituted with Tb, Lu, and the like, such as $Tb_3Al_5O_{12}$:Ce and $Lu_3Al_5O_{12}$:Ce.

Examples of other phosphors include ZnS:Eu, $Zn_2GeO_4$: Mn, and $MGa_2S_4$:Eu (wherein M represents at least one material selected from Sr, Ca, Ba, Mg, and Zn; X represents at least one material selected from F, Cl, Br, and I).

The above-described phosphors may include at least one material selected from Tb, Cu, Ag, Au, Cr, Nd, Dy, Co, Ni, and Ti, as a substitute for Eu, or in addition to Eu, as needed.

Moreover, other phosphors than the above-described phosphors, that have similar properties and effects can also be used.

With the exciting light from the light emitting element 10, each of the above described phosphors has an emission spectrum in yellow, red, green, and blue. Besides these phosphors, other phosphors each having an emission spectrum in neutral colors of yellow, blue-green, orange, and the like can be used. By using these phosphors in combination, light emitting devices with various emission colors can be provided.

For example, by using the GaN-based compound semiconductor that emits blue light, the fluorescent material such as $Y_3Al_5O_{12}$:Ce or $(Y_{0.8}Gd_{0.2})_3Al_5O_{12}$:Ce is irradiated to convert the wavelength. The light from the light emitting element 10 and the light from the phosphor 60 are mixed, thus, the light emitting device capable of emitting white light can be provided.

For example, by using the phosphor 60 comprising $CaSi_2O_2N$:Eu or $SrSi_2O_2N_2$:Eu which emits light between green and yellow, blue-emitting $(Sr, Ca)_5(PO_4)_3Cl$:Eu, and red-emitting $(Ca,Sr)_2Si_5N_8$:Eu, the light emitting device capable of emitting white light with excellent color rendering properties can be provided. Here, the three primary colors of red, blue, and green are used, so that a desired white light can be obtained by changing the compounding ratio of the first fluorescent material and the second fluorescent material.

<Light Diffusing Member>

Instead of the fluorescent materials described above, or in combination with them, a light diffusing member may be incorporated in the glass 30. Examples of the light diffusing member include barium titanate, titanium oxide, aluminum oxide, and silicon oxide.

In the present specification, there is no rigid distinction between the fluorescent material, the light diffusing member, the filler, and the ceramic powder, and a material with a high reflectivity among the fluorescent materials that act as a light diffusing member. In the present specification, a light diffusing member has a center particle diameter of 1 nm to less than 5 μm. The light diffusing member having a center particle diameter of 1 nm to less than 5 μm diffusely reflects the light from the light emitting element 10 and the phosphor excellently. Also irregularity in color caused by using a phosphor with a large particle size can be controlled. Moreover, the half-width of the emission spectrum can be reduced and a light emitting device having a high color purity can be obtained. On the other hand, a light diffusing member having particles of 1 nm to less than 1 μm has high transparency and can enhance a viscosity of the glass without decreasing the luminosity.

<Filler>

A filler may be incorporated in the glass 30 in substitution for the fluorescent material described above, or in combination with the fluorescent material and the light diffusing member. Although the specific material for the filler is similar to the light diffusing member, the center particle diameter of the filler is different from that of the light diffusing member. In the present specification, the fillers are particles of which the center particle diameter is from 5 μm to 100 μm. When a filler having such particle size is incorporated in the glass 30, an irregularity in chromaticity of the light emitting device can be controlled due to light diffusion effect. The fluidity of the glass 30 can be maintained at a constant level, so that the light emitting devices can be manufactured with good production yield in quantity production. It is preferable that a filler has a similar particle size and/or shape to that of the fluorescent material. A "similar particle size" means that a difference of the respective circularities is less than 20%. Circularity shows a degree of approximation of a particle to a perfect circle. (circularity=circumference of a perfect circle having the equal area to the projected area of the particle/circumference of the projection of the particle). By using such a filler, the fluorescent material and the filler affect each other and the fluorescent material can be dispersed well in the glass, so that irregularity in color can be prevented.

<Ceramic Powder>

In substitution for the fluorescent material described above, or in combination with the fluorescent material, the light diffusing member, and the filler, a ceramic powder may be incorporated in the glass 30. The material of the ceramic powder is $SiO_2$, $Al_2O_3$, AlN, SiC, $ZrO_2$, $TiO_2$, TiN, $Si_3N_4$, $SnO_2$, and the like, and in some cases, the material is common with the fluorescent material, the light diffusing member, and the filler. The size of the ceramic powder is from several μm to several dozen μm with the shape being approximately spherical, approximately elliptical, polygonal, and the like.

<Coating>

It is preferable that a coating is disposed on the surface of the glass 30. The coating can prevent the glass 30 from becoming cloudy which is caused by crystallization of the glass. With the coating, permeation of moisture can also be prevented. A coating including a filler and the like can be used. For example, by using a coating which absorbs light having a predetermined wavelength (light with wavelengths of 350 nm or less and 550 nm or more), the light emitting device capable of extracting light having a specific wavelength range (from 350 nm to 550 nm) can be provided. As for the coating, not only a single layer, but also a multilayered coating can also be used. With a multilayered structure, the transmission factor can also be improved.

<Manufacturing Method of Light Emitting Device>

The light emitting device according to the first embodiment is described below in reference to the accompanying drawings. FIGS. 3 to 9 are schematic cross-sectional views (1) to (7) showing a manufacturing method according to the first embodiment. Here, the substrate electrode 21 is disposed on each portion corresponding to the side surface of the substrate 20 which has been individually divided, and this feature has been omitted from the drawings for the sake of simplicity.

(1) Dispose a substrate electrode 21 having a predetermined pattern on a substrate 20.

A substrate electrode 21 having a predetermined pattern is disposed on a substrate 20 such as a ceramic. The substrate electrode 21 is disposed by methods such as screen printing and plating. It is preferable that the surface of the substrate 20 has a cut on the rear surface which is the opposite side from the surface contacting with the glass 30.

(2) Dispose a bump 40 on the substrate electrode 21.

Heat is applied to a bump 40 to connect it to the substrate electrode 21. At this time, an ultrasound may be applied with heat. The bump 40 may preferably be formed in a spherical shape or an oval shape.

(3) A light emitting element 10 is mounted face-down on the substrate electrode 21 by way of flip chip bonding, and an n-side electrode 11 and a p-side electrode 12, which are on a common surface side of the light emitting element 10, and the substrate electrode 21 are electrically connected (the first step). The step (3) may be carried out concurrently with the step (2).

The light emitting element 10 has the n-electrode 11 and the p-electrode 12 on the same planar side and a light transmissive substrate on the opposite planar side. The light transmissive substrate is sucked with a collet and the like and the n-side electrode 11 and the p-side electrode 12 are placed face-down. An ultrasonic vibration is applied to the light emitting element 10 to connect the n-side electrode 11 and the p-side electrode 12 with the bumps 40. After the light emitting element 10 and the bumps 40 are connected, the suction of the collet is stopped and the collet and the like are removed.

(4) Heat the glass 30 up to temperatures from the glass transition temperature of the glass 30 to below the melting point of the glass 30 (the second step). The substrate 20 having the light emitting element 10 mounted thereon is put in a predetermined apparatus. The apparatus has an upper metallic mold and a lower metallic mold and capable of holding its interior at a predetermined temperature. Besides an inert-gas atmosphere such as an nitrogen atmosphere and an argon atmosphere, the interior of the apparatus can also be held with a vacuum to prevent formation of an oxide film on the metal such as the substrate electrode 21. The lower metallic mold, the glass 30, the substrate 20 having the light emitting element 10 mounted thereon, and the upper metallic mold are placed in sequence. The light emitting element 10 is placed between the glass 30 and the substrate 20. Heat is applied to the lower metallic mold until the temperature of the glass 30 reaches to between the glass transition temperature to below the melting point of the glass 30. With this arrangement, the glass 30 achieves a softened state. It is provided that the glass 30 is not liquefied because it is at a temperature below the melting point. The glass 30 is preferably heated to a temperature from 200° C. to 800° C. Specifically, it is also possible to heat the glass to a temperature from 500° C. to 600° C. to soften it. Heating and cooling can be carried out in one step. However, it is preferable to carry out heating and cooling in several steps respectively, to avoid cracking the glass 30 during cooling.

(5) The glass 30 is pressed against the substrate 20 having the light emitting element 10 mounted thereon (the third step). In the figures, the glass 30 is placed on the upper aspect and the upper surface 30a of the glass 30 is in contact with the lower metallic mold.

With the glass 30 being in its softened state, the upper metallic mold and the lower metallic mold are pressed so as to press the glass 30 against the substrate 20. The glass 30 is in its softened state, so that the glass can make contact with the substrate 20 without destroying the light emitting element 10. A gas layer 50 is formed in the space between the substrate electrode 21 of the substrate 20 and the light emitting element 10 which are placed together via the bumps 40. When a fluid substance is dropped, it moves into the space between the light emitting element 10 and the substrate electrode 21. However, with the softened glass 30, little glass 30 moves into this space. An insulating member such as an epoxy resin may also be provided preliminarily in the space between the light emitting element 10 and the substrate electrode 21 which are placed via the bumps 40. With this construction, heat generated from the light emitting element 10 can be transmitted easily to the substrate electrode 21 side and heat dissipation can be improved. Moreover, by using a predetermined mold as the lower metallic mold, the glass 30 can be formed with a predetermined shape, such as a lenticular shape.

(6) Cool the glass 30 (the fourth step).

After pressing the softened glass 30 to make contact with the substrate 20 and the substrate electrode 21, the glass 30 is cooled to fix it to the substrate 20. Cooling can be carried out in one step; however, it can also be carried out in several steps. Cooling may also be carried out while pressing the glass 30 and the substrate 20 with the upper metallic mold and the lower metallic mold. Cooling may also be carried out with the lower metallic mold or the upper metallic mold removed when the glass is half-solidified.

(7) The light emitting element is cut out by cutting the glass 30 (the fifth step).

The substrate 20 having the glass 30 fixed thereon is taken out of the apparatus. The upper surface 30a of the glass 30 can be used as it is; however, it is preferable to polish it to improve its transmittance of light. After the substrate 20 is taken out from the apparatus, the glass is polished or cut by using a cutting instrument 90 to a predetermined position. The glass 30 is cut to a portion where the glass 30 and the substrate 20 are in contact. With this cutting process, the side surface 30b of the glass 30 that becomes a light emitting device is formed. The glass 30 may also be cut to an extent not to reach the contact portion of the glass 30 and the substrate 20. Then, a predetermined stress is applied and the glass 30 is divided with the substrate 20. The side surface 30b of the glass 30 has a portion formed by cutting and a portion formed by dividing by applying stress. The side surface 30b of the glass 30 may also be polished to avoid unevenness of individual products. It is preferable to divide the substrate 20 along the portion where the cut was made in the rear surface opposite to the side where the glass 30 was fixed.

(8) A coating (not specifically shown in the figures) can be disposed on the surface of the glass 30.

Disposing the coating may be carried out before cutting the glass 30. Besides adhering a predetermined sheet, other methods can be used to dispose the coating, such as by spraying on a desired portion, by dipping the glass 30 into a predetermined liquid, and by screen printing a predetermined substance.

By carrying out the above-described steps, the light emitting device having the glass 30 fixed to the substrate 20 can be provided.

Second Embodiment

Figure 10:
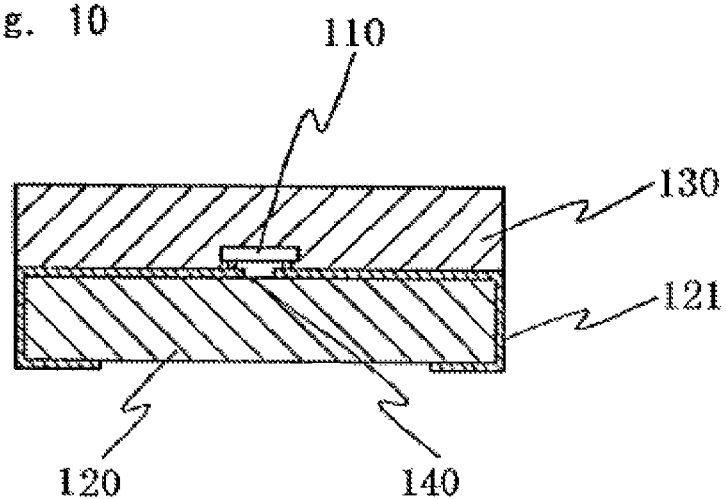
FIG. 10 is a schematic cross-sectional view showing a light emitting device according to a second embodiment.

A second preferred embodiment will be described below. FIG. 10 is a schematic cross sectional view showing a light emitting device according to the second embodiment. Portions having constructions similar to the first embodiment are omitted from this description.

In a light emitting device according to the second embodiment, at least one through-hole is made in the substrate 120, a predetermined conductive pattern is disposed, and the substrate electrode 121 is disposed. The light emitting element 110 is mounted on the substrate 120. Au is used for the bumps 140. Cuts are made into the substrate 120 and the glass 130 from the vertical directions. Then, stress is applied along the cut to divide into the light emitting device. With this, the side surfaces of the glass 130 and the substrate electrode 121 locate on approximately the same plane, so that mounting of the light emitting device can be carried out easily, and in addition, polishing of the glass 130 can be easily carried out.

Third Embodiment

Figure 11:
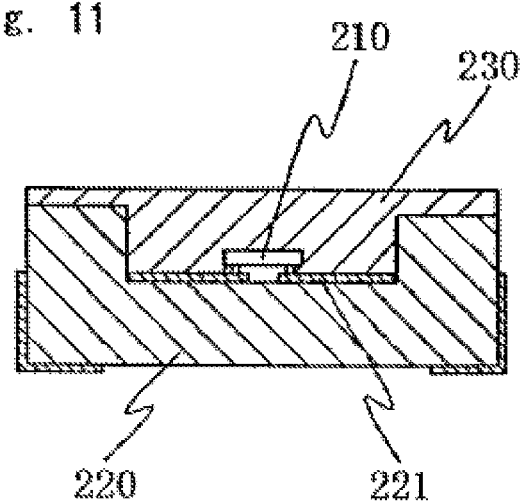
FIG. 11 is a schematic cross-sectional view showing a light emitting device according to a third embodiment.

A third preferred embodiment will be described below. FIG. 11 is a schematic cross sectional view showing a light emitting device according to the third embodiment. Portions having constructions similar to the first embodiment are omitted from this description.

A substrate 220 has a recess defined by a bottom surface and a side surface. A substrate electrode 221 is disposed in the bottom surface of the recess. A ceramic is used for the substrate 220. Ceramic greensheets with predetermined openings are stacked and fired to form the substrate 220, and a metal is disposed with a predetermined pattern to form the substrate electrode 221. A cut of a desired depth is made in the stacked greensheets before firing. A light transmissive glass with a thickness larger than the depth of the recess is used before the glass is softened. A light emitting element 210 is mounted on the substrate electrode 221 disposed in the bottom surface of the recess by way of flip-chip bonding. A softened glass 230 is pressed against the substrate 220. The glass 230 is pressed until it is positioned in the recess. The glass 230 is fixed to the bottom surface and the side surface of the recess and to the portion which is above the recess. This is to increase the contact area between the glass 230 and the substrate 220 and to fix it more firmly. Predetermined polishing is carried out to the glass 230 along the cut made in the ceramic greensheets that becomes the substrate 220. The substrate 220 and the glass 230 are divided along the cut to obtain each light emitting device.

In detail, a recess wherein the light emitting element 210 is mounted is formed by sticking the ceramic greensheets with a through-hole to form a multi layer, and the like. Therefore, by stacking the greensheets each having an opening whose circumference is circular, elliptical, approximately rectangular, and the like, or has a different diameter, when viewed from the light emitting front side, it is possible to form a stepped inner wall of an opening portion. Further, by stacking the greensheets each having a through-hole in such way that the diameter of the though-hole widens in one direction, and using them in combination with the greensheets having various shapes and through-holes with different diameters, a recess broaden out toward its opening can be formed. Here, the greensheets having the through-hole with its opening widening in one direction may be made by cutting using a cutting blade with a tapered shape. Alternatively, such a shape may be formed by changing the angle of a cutting blade, which is usually used to form a through-hole to the surface of the greensheets. Further, by stacking a plurality of greensheets with a through-hole so that the diameter of the through-hole is changed stepwise, a stepped inner wall may be formed. Then, by pressing a metallic mold to the inner stepped wall and making a smooth surface, a greensheet having a through-hole with a widening opening can be formed. A positional offset of each layer due to stacking can be prevented by arranging the recess and the like outside of the substrate 220. Besides using only ceramics, a member other than a ceramic such as a metallic member and an inorganic member can be used between each greensheet. By forming a plurality of steps on the sidewall defining the recess, the contact area between the glass 230 and the substrate 220 can also be increased, so that the fixing strength can be also increased.

Fourth Embodiment

Figure 12:
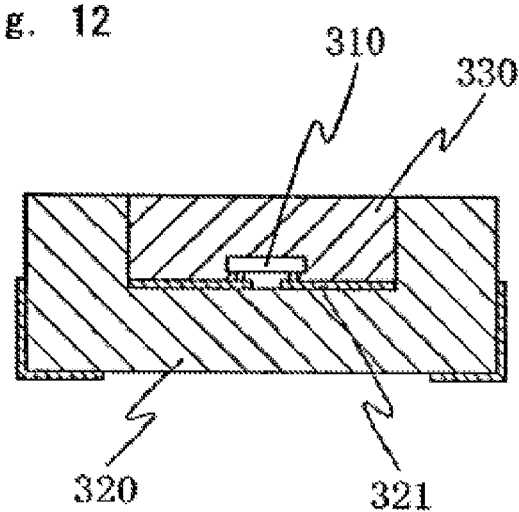
FIG. 12 is a schematic cross-sectional view showing a light emitting device according to a fourth embodiment.

A fourth preferred embodiment will be described below. FIG. 12 is a schematic cross sectional view showing a light emitting device according to the fourth embodiment. Portions having constructions similar to the first embodiment are omitted from this description.

A ceramic is used for a substrate 320. A substrate electrode 321 is disposed on the substrate 320. A light emitting element 310 is mounted on the substrate 320. The substrate 320 has a recess defined by a bottom surface and a side surface. The glass 330 is disposed in the recess. The glass 330 is formed by pressing so that the glass 330 is disposed thinly over the recess. Water can be prevented from getting into the substrate 320 with this construction. An upper portion of the ceramic can be exposed by polishing the glass 330 over the recess. The glass 330 may include a fluorescent material. A light diffusing member may be included with the fluorescent material.

Fifth Embodiment

Figure 13:
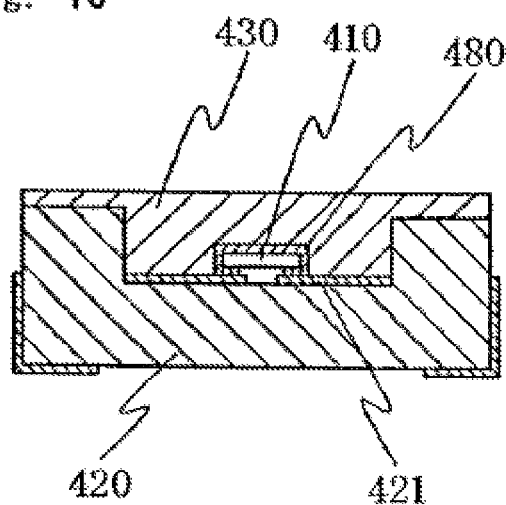
FIG. 13 is a schematic cross-sectional view showing a light emitting device according to a fifth embodiment.

A fifth preferred embodiment will be described below. FIG. 13 is a schematic cross sectional view showing a light emitting device according to the fifth embodiment. Portions having constructions similar to the first embodiment and the third embodiment are omitted from this description.

A substrate 420 has a recess defined by a bottom surface and a side surface. A substrate electrode 421 is disposed in the bottom surface of the recess and a light emitting element 410 is placed thereon. The light emitting element 410 is mounted with flip-chip bonding and covered with a covering member 480. A fluorescent material powder, a ceramic powder and the like can be used for the covering member 480. The fluorescent material may be mixed in a predetermined liquid, sol, gel, and the like. For example, when a fluorescent material powder is used for the covering member 480, a fluorescent material mixed in water or an organic solvent is adhered around the light emitting element 410. A glass 430 prior to being softened is placed adjacent to the substrate 420 having the light emitting element 410 disposed thereon is then put in an apparatus. When the temperature in the apparatus is raised to soften the glass 430, the water and the organic solvent evaporate. The temperature in the apparatus is further raised to soften the glass 430. The softened glass 430 is pressed against the substrate 420 and the glass 430 is fixed to the substrate 420. At this time, the light emitting element 410 is not covered directly with the glass 430 and is covered by the glass 430 via the covering member 480 which covers the light emitting element 410. With this arrangement, the amount of the fluorescent material can be reduced and the orientation characteristic can be improved. Not only the light emitting element 410, but also the light emitting element 410 and a substrate electrode 421 may also be covered. The covering member 480 may be disposed easily in the vicinity of the light emitting element 410.

Sixth Embodiment

Figure 14:
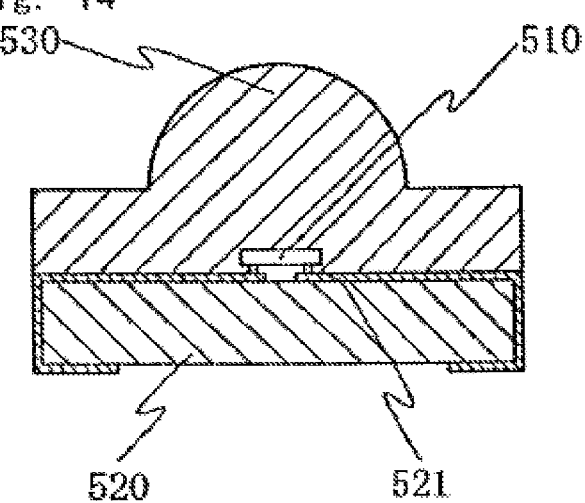
FIG. 14 is a schematic cross-sectional view showing a light emitting device according to a sixth embodiment.

A sixth preferred embodiment will be described below. FIG. 14 is a schematic cross sectional view showing a light emitting device according to the sixth embodiment. Portions having constructions similar to the second embodiment are omitted from this description.

A substrate electrode 521 is disposed on a substrate 520.

A glass 530 has a predetermined lenticular shape. The lens is a body of rotation centering on the portion where the light emitting element 510 is disposed. By using a mold having a shape to form a predetermined lenticular shape, a glass 530 is formed. The glass 530 is heated to soften and filled in the mold by pressing the glass 530. The glass 530 having a lenticular shape is cut by using a cutting apparatus. At this time, the substrate 520 can also be cut with the glass 530. A fluorescent material may be included in the lenticular glass 530. Various configurations of lenses can be employed, such as a Fresnel lens, a convex lens, a concave lens, a narrow lens, and a wide lens.

Seventh Embodiment

Figure 15:
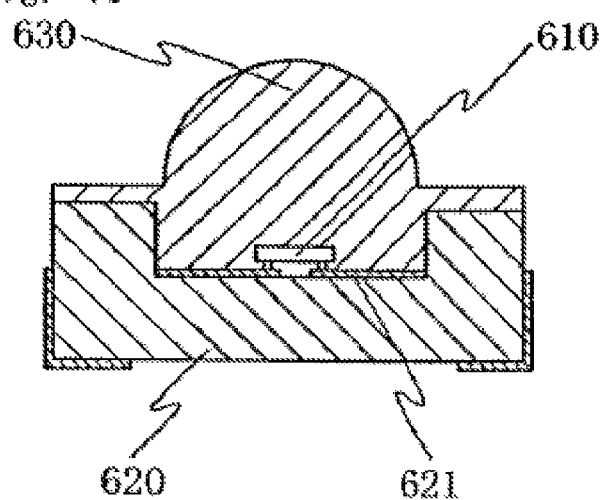
FIG. 15 is a schematic cross-sectional view showing a light emitting device according to a seventh embodiment.

A seventh preferred embodiment will be described below. FIG. 15 is a schematic cross sectional view showing a light emitting device according to the seventh embodiment. Portions having constructions similar to the third embodiment are omitted from the description.

A substrate 620 has a recess defined by a bottom surface and a side surface. A substrate electrode 621 is disposed on the substrate 620. A light emitting element 610 is disposed in the bottom surface of the recess. A glass 630 having a lenticular shape is disposed over the recess. By disposing the glass 630 having a lenticular shape, light emitted from the light emitting element 610 can be concentrated. Especially, light reflected at the bottom surface and the side surface defining the recess transmits through the glass 630 having a lenticular shape and is outputted outside. Because the glass 630 covers over the recess, the substrate 620 can be protected from elements such as water and dust.

Eighth Embodiment

Figure 16:
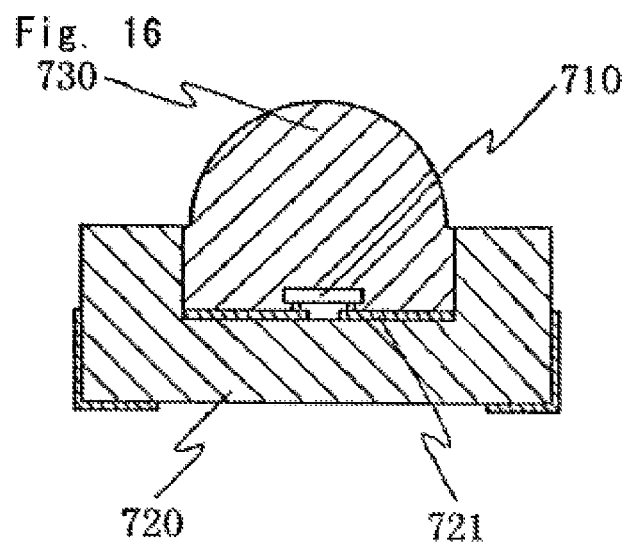
FIG. 16 is a schematic cross-sectional view showing a light emitting device according to an eighth embodiment.

A eighth preferred embodiment will be described below. FIG. 16 is a schematic cross sectional view showing a light emitting device according to the eighth embodiment. Portions having constructions similar to the fourth embodiment are omitted from this description.

A substrate 720 has a recess defined by a bottom surface and a side surface. A substrate electrode 721 is disposed in the bottom surface of the recess. A light emitting element 710 is disposed in the bottom surface of the recess. A glass 730 having a lenticular shape is disposed over the recess. Besides forming the lenticular glass 730 with a diameter approximately the same as the diameter of the opening portion of the recess, the lenticular glass 730 can also be formed with a smaller diameter than that of the opening portion of the recess.

Ninth Embodiment

Figure 17:
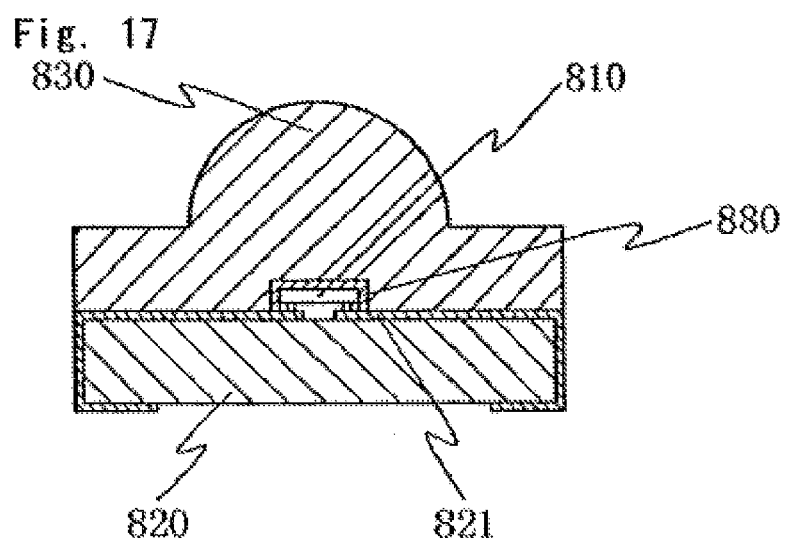
FIG. 17 is a schematic cross-sectional view showing a light emitting device according to a ninth embodiment.

A ninth preferred embodiment will be described below. FIG. 17 is a schematic cross sectional view showing a light emitting device according to the ninth embodiment. Portions having constructions similar to the first embodiment, the third embodiment, and the fifth embodiment are omitted from this description.

A substrate 820 is planar and a predetermined substrate electrode 821 is disposed thereon. A light emitting element 810 is disposed on the substrate electrode 821. A covering member 880 is disposed in the vicinity of the light emitting element 810. A glass 830 having a lenticular shape is disposed over the light emitting element 810. Light emitted from the light emitting element 810 is concentrated above. The light emitting element 810 is covered with a covering member 880. The covering member 880 is a fluorescent material and is hardened in a predetermined shape. The covering member 880 may be formed by way of screen printing or electrodeposition. A mold having a predetermined shape is pressed against the glass 830 in a softened state to form the lens shape. Light emitted from the side surface of the light emitting element 810 is also absorbed by the covering member 880 using a fluorescent material, and its wavelength is converted and discharged to the outside.

Tenth Embodiment

Figure 18:
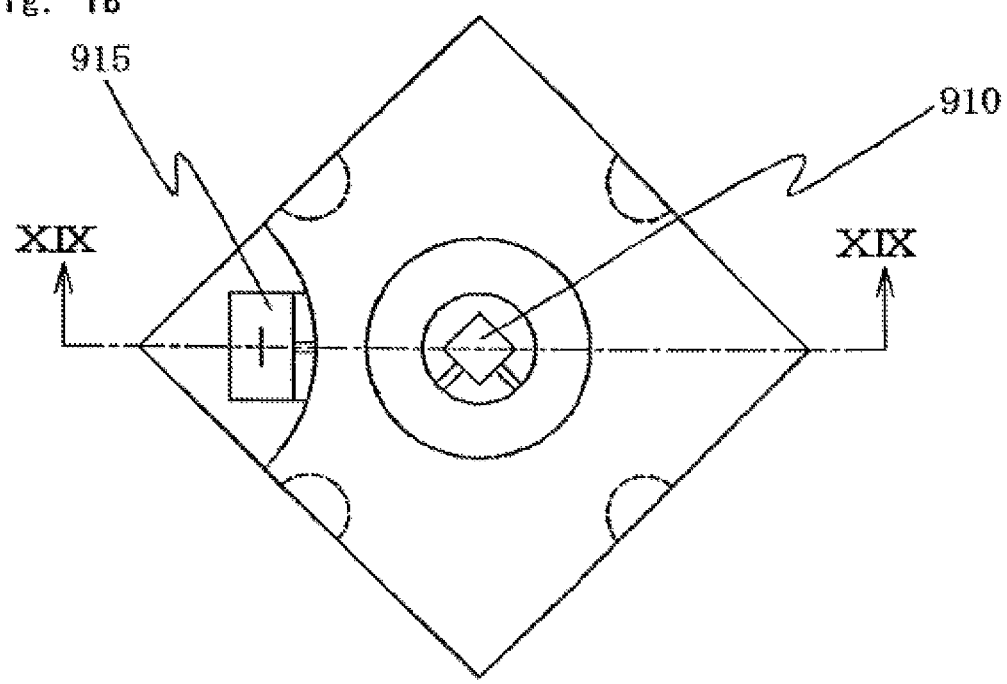
FIG. 18 is a schematic plan view showing a light emitting device according to a tenth embodiment.
Figure 19:
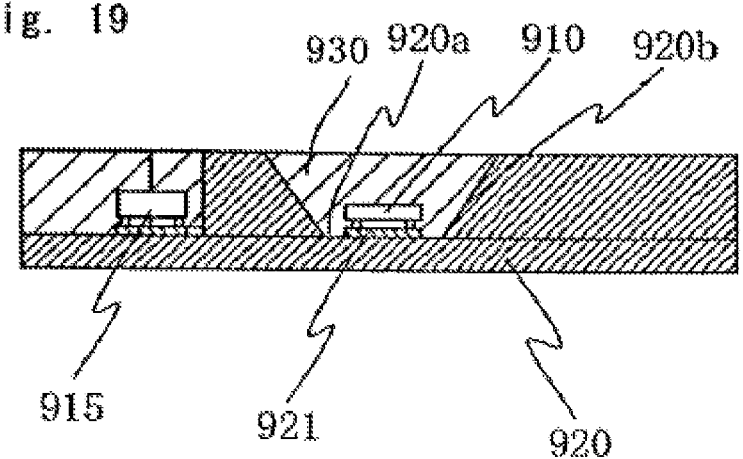
FIG. 19 is a schematic cross-sectional view showing a light emitting device according to the tenth embodiment.

A tenth preferred embodiment will be described below. FIG. 18 is a schematic plan view showing a light emitting device according to the tenth embodiment. FIG. 19 is a schematic cross sectional view showing a light emitting device according to the tenth embodiment. The schematic cross-sectional view in FIG. 19 is a view taken along line XIX-XIX of FIG. 18. Portions having constructions similar to the first embodiment are omitted from this description.

A substrate 920 having a bowl-shaped recess whose diameter of opening increases towards its opening. The recess is defined by a bottom surface 920a and a side surface 920b. A substrate electrode 921 is disposed in the bottom surface 920a of the recess. A light emitting element 910 is mounted in the bottom surface 920a of the recess of the substrate 920. A step is formed in a corner of the substrate 920 and a protective element 915 is disposed in the bottom surface of the step. The protective element 915 has a pair of positive and negative electrodes on a common surface side. A metallic member is disposed on the bottom surface 920a and the side surface 920b of the recess, so that light emitted from the light emitting element 910 irradiates the side surface 920b and is reflected and discharged to the emission front. A member having high reflectivity may be plated on the side surface 920b of the recess. A portion of the substrate 920 defining the opening may take various shapes such as circle, oval, or may be approximately a rectangle. A slight protrusion may be provided to prevent separation of a glass 930 and the substrate 920. The protective element 915 is fixed to the glass 930 in a similar way as the light emitting element 910. Besides this, the protective element 915 may be disposed in the recess of the substrate 920. With this arrangement, a step in a corner of the substrate 920 does not need to be made, and molding can be carried out easily. AlN, GaN, and the like may be used for the substrate 920.

Eleventh Embodiment

Figure 20:
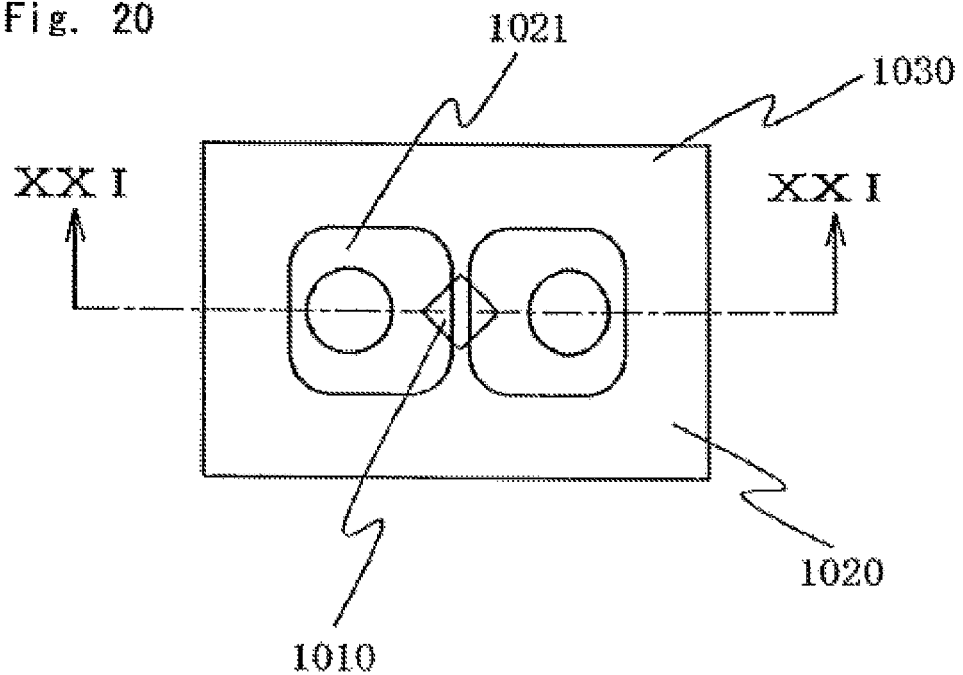
FIG. 20 is a schematic plan view showing a light emitting device according to an eleventh embodiment.
Figure 21:
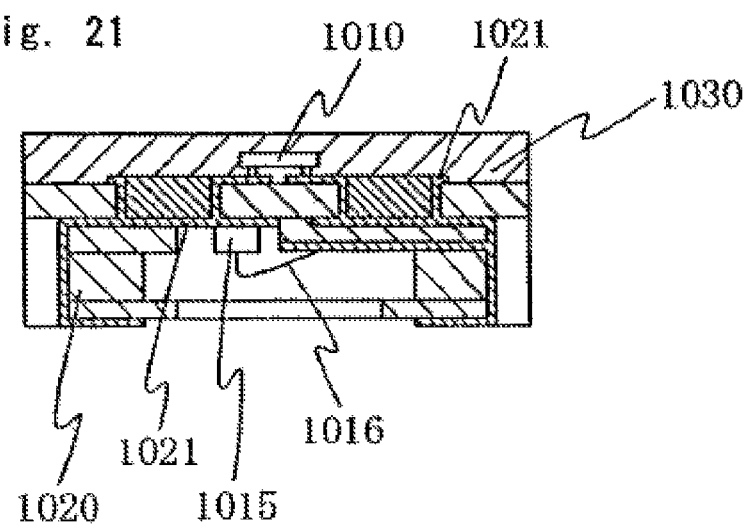
FIG. 21 is a schematic cross-sectional view showing a light emitting device according to the eleventh embodiment.

A eleventh preferred embodiment will be described below. FIG. 20 is a schematic plan view showing a light emitting device according to the eleventh embodiment. FIG. 21 is a schematic cross sectional view showing a light emitting device according to the eleventh embodiment. The schematic cross-sectional view in FIG. 21 is a view taken along line XXI-XXI of FIG. 20. Portions having constructions similar to the first embodiment are omitted from this description.

A substrate 1020 is formed having a stacked layer of ceramic greensheets each having a predetermined throughhole. A portion of the substrate 1020 has a through-hole and a conductive member is disposed therein. A predetermined conductive pattern is disposed on the stacked layer of the ceramic greensheets. The substrate electrode 1021 is disposed on each side of the substrate 1020 so that conduction can be established at the rear surface side of the electrode. The rear side of the substrate 1020 has a recess defined by a bottom surface and a side surface, and a substrate electrode 1021 is disposed therein. The substrate electrode 1021 disposed on the rear surface side and the substrate electrode 1021 whereon the light emitting element 1010 is to be mounted are electrically connected. A protective element 1015 is disposed on the substrate electrode 1021 disposed in the bottom surface of the recess made on the reverse side. The protective element 1015 has an electrode on both the lower surface and the upper surface. The electrode of the upper side of the protective element 1015 is electrically connected with the substrate electrode 1021 through a wire 1016, and the electrode of the lower side of the protective element 1015 is electrically connected with the substrate electrode 1021 via a die bonding resin. With this arrangement, a light emitting device having a protective element 1015 mounted thereon using the wire 1016 can be provided. Besides by mounting the protective element 1015 at the time of flip-chip mounting the light emitting element 1010, the protective element 1015 may be mounted after fixing the glass 1030 on the substrate 1020.

Twelfth Embodiment

Figure 22:
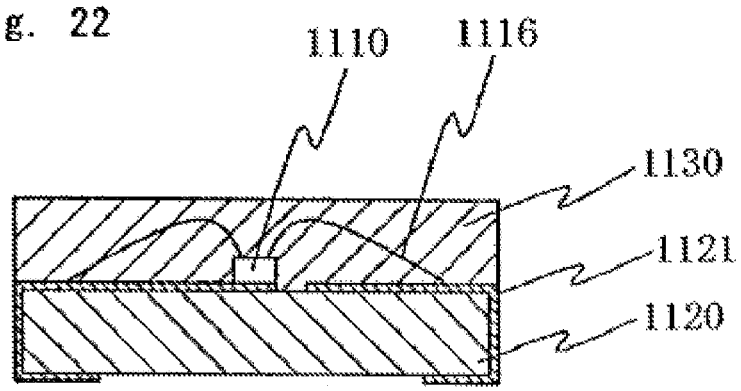
FIG. 22 is a schematic cross-sectional view showing a light emitting device according to a twelfth embodiment.
Figure 23:
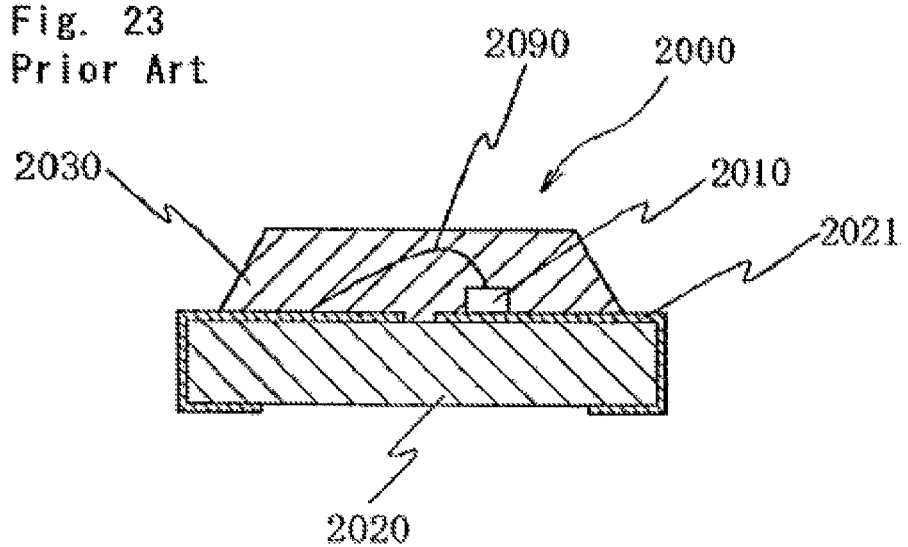
FIG. 23 is a schematic cross-sectional view showing a conventional light emitting device.

A twelfth preferred embodiment will be described below. FIG. 22 is a schematic cross-sectional view showing a light emitting device according to the twelfth embodiment. Portions having constructions similar to the first embodiment are omitted from this description.

A light emitting element 1110 has an n-side electrode and a p-side electrode on a same planar side. The light emitting element 1110 is mounted face-up on a substrate 1120. The substrate 1120 has a substrate electrode 1121 and the light emitting element 1110 is mounted thereon. The light emitting element 1110 may be mounted on a heat sink so that the substrate electrode 1121 may be attached to a different member. The n-side electrode and the p-side electrode of the light emitting element 1110 and the substrate electrode 1121 are electrically connected through wires 1116 respectively. The wires 1116 have a diameter that can endure the pressure applied by the glass 1130. A glass 1130 is placed in a lower metallic mold, and a substrate 1120 having the light emitting element 1110 mounted thereon with face-up configuration is placed in an upper metallic mold. Then, the metallic molds are respectively set in an apparatus. A predetermined temperature is applied to the glass 1130 which is placed in the lower metallic mold, to soften the glass 1130. An upper metallic mold is pressed against the softened glass 1130. With this arrangement, the glass 1130 is fixed to the substrate 1120. Because the glass 1130 is in the softened state, detachment of the wires 1116 are not caused.

The manufacturing method for the light emitting device is approximately similar to that in the first embodiment, except for the first step. In the first step, a light emitting element 1110 is mounted on a substrate 1120 using a die bonding member. An epoxy resin, a silicone resin, a modified epoxy resin, a modified silicone resin, and the like may be used, and Ag filler and the like may also be mixed in. The light emitting element 1110 may be mounted on the substrate electrode 1121. Afterwards, the electrodes of the light emitting element 1110 and the substrate electrode 1121 are electrically connected via the wires 1116. The light emitting element 1110 is mounted on the substrate 1120 in such manner as to be pressed against the glass 1130 which is in the softened state, in the next step.

EXAMPLE

Example 1

Example 1 will be described below. FIG. 1 is a schematic perspective view showing a light emitting device according to the first embodiment. FIG. 2 is a schematic plan view showing a light emitting device according to the first embodiment.

The first embodiment is selected arbitrarily to be taken into consideration. A light emitting element 10 is mounted on a substrate 20. The light emitting element 10 has an n-side electrode 11 and a p-side electrode 12 on a same planar side and are mounted face-down by way of a flip-chip mounting. For the light emitting element 10, a blue-light emitting element having a peak emission wavelength at about 460 nm is used. AlN is used for the substrate 20. The four corners of the substrate 20 have a shape formed by making a through-hole and then dividing them. The shorter edges of the substrate 20 also have a shape formed by making a through-hole and dividing them. At the portion of the through-holes, the substrate electrodes 21 are disposed so as to establish an electric connection between the upper surface and the lower surface of the substrate 20.

The substrate electrode 21 is divided into an n-side substrate electrode and a p-side substrate electrode, and a conductive pattern is formed from the upper surface through the side surface to the bottom surface of the substrate 20.

A lead-free glass having a deformation point (At) of 546° C. and a transition point (Tg) of 518° C. is used as the glass 30. A mixture including 0 to 10 weight % of $SiO_2$ (silica), 20 to 30 weight % of $B_2O_3$ (boron oxide), 50 to 60 weight % of ZnO (zinc oxide), and 0 to 10 weight % of $TiO_2$ (titanium oxide) is used as the material for the glass 30.

The size of the light emitting device is 3.0 mm in length, 2.0 mm in width, and 1.5 mm in height. The size of the substrate 20 is 3.0 mm in length, 2.0 mm in width, and 1.0 mm in height. The size of the glass 30 is 2.9 mm in length, 1.9 mm in width, and 0.5 mm in height.

The light emitting element 10 is mounted on the substrate electrode 21 of the substrate 20 in a face-down manner by way of flip chip mounting. A cut has been made in the substrate 20 to the extent of about ⅖ to ⅗ of the thickness of the substrate. The cut has been made in the opposite side from the side whereon the light emitting element 10 is disposed. The glass 30 before softening is placed in a lower metallic mold, and the substrate 20 is placed so as to sandwich the light emitting element 10. Both the lower metallic mold and the upper metallic mold are planar. The interior of the apparatus is filled with nitrogen and the temperature of the lower metallic mold is raised slowly to about 560° C. When the glass 30 softens, pressure is applied to a predetermined position by using the lower metallic mold and the upper metallic mold. Afterwards, the temperature is reduced slowly. When the lower metallic mold and the upper metallic mold are cooled to below a predetermined temperature, the upper metallic mold and the lower metallic mold are removed and the substrate 20 having the glass 30 fixed thereto is taken out from the apparatus. A cut is made from above the surface of the glass 30 to a depth of about 0.5 mm, by using a cutter. Afterwards, the glass 30 and the substrate 20 are divided along the cut. Thus, the light emitting device can be fabricated. The glass 30 is smaller than the substrate 20 to the extent that it corresponds to the cut made by the cutter.

INDUSTRIAL APPLICABILITY

A light emitting device according to the present invention can be used in a backlight of a portable telephone, a display capable of showing various data, a light source for various sensors such as a line sensor, and an indicator, and for a light emitting device used for a indication of various measuring instruments and outdoor guide plates.

It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

What is claimed is:

1. A light emitting device comprising:
   a light emitting element having positive and negative electrodes disposed thereon;
   a substrate having a plurality of side walls including at least one corner arched side wall portion, the plurality of side walls including the at least one corner arched side wall portion directly connect and extend from an upper surface of said substrate to a lower surface of said substrate, said substrate having said light emitting element mounted thereon and said substrate having a substrate electrode, wherein said electrodes of said light emitting element being electrically connected to said substrate electrode; and
   a glass covering said light emitting element and said glass having a glass transition temperature (Tg) of from 300° C. to 700° C., wherein said glass includes lead and has a melting point of at least 410° C. and wherein a portion of said glass extends beyond a portion of said at least one corner arched side wall portion.

2. The light emitting device according to claim 1, wherein a side surface of said glass is polished.

3. The light emitting device according to claim 1, wherein an upper surface of said glass is polished.

4. The light emitting device according to claim 1, wherein said light emitting element has said positive and negative electrodes on a common surface side, said light emitting element is mounted face-down, and a gas is disposed between said light emitting element and said substrate.

5. The light emitting device according to claim 1, wherein said light emitting element has said positive and negative electrodes on a common surface side, said light emitting element is mounted face-down, and a insulating member is included between said light emitting element and said substrate.

6. The light emitting device according to claim 1, wherein said glass is fixed to said substrate by way of pressing.

7. The light emitting device according to claim 1, wherein said substrate is a ceramic.

8. The light emitting device according to claim 1, wherein said substrate has a recess defined by a bottom surface and a side surface, and said substrate electrode is disposed in the bottom surface of the recess.

9. The light emitting device according to claim 1, wherein said glass has a lenticular shape.

10. The light emitting device according to claim 1, wherein said glass includes lead of 100 ppm or less.

11. The light emitting device according to claim 1, wherein said glass includes at least one material selected from the group consisting of a fluorescent material, a pigment, a filler, a light diffusing member, and a ceramic powder.

12. The light emitting device according to claim 1, wherein said light emitting element is covered with a covering member, and said covering member is covered with said glass.

13. The light emitting device according to claim 12, wherein said covering member includes at least one material selected from the group consisting of a fluorescent material, a pigment, a filler, a light diffusing member, and a ceramic powder.

14. The light emitting device according to claim 1, further comprising:
   a protective element disposed on said substrate, wherein said protective element is disposed on a side opposite to a side where said light emitting element is mounted.

15. The light emitting device according to claim 1, wherein opposing side surfaces of said substrate extending from the upper surface of the substrate to the lower surface of the substrate each include a recessed portion therein.

16. A light emitting device comprising:
   a light emitting element having positive and negative electrodes disposed thereon;
   a substrate being approximately hexahedron shaped with a plurality of side walls and at least one corner arched side wall portion, the plurality of side walls including the corner arched side wall portion directly connect and extend from an upper surface of said substrate to a lower surface of said substrate, said substrate having said light emitting element mounted thereon and said substrate having a substrate electrode, wherein said electrodes of said light emitting element being electrically connected to said substrate electrode; and
   a glass covering said light emitting element and said glass having a glass transition temperature (Tg) of from 300° C. to 700° C., wherein said glass includes lead and has a melting point of at least 410° C. and wherein a portion of said glass extends beyond a side of said substrate including a portion of said at least one corner arched side wall portion.

17. The light emitting device according to claim 16, wherein said light emitting element is covered with a covering member, and said covering member is covered with said glass.

18. The light emitting device according to claim 16, wherein said glass has a lenticular shape.

19. The light emitting device according to claim 16, wherein opposing side surfaces of said substrate extending from the upper surface of the substrate to the lower surface of the substrate each include a recessed portion therein.

20. A light emitting device comprising:
   a light emitting element having positive and negative electrodes disposed thereon;
   a substrate being approximately hexahedron shaped with a plurality of planar side walls and a plurality of corner arched side walls, the plurality of planar side walls and the corner arched side walls directly connect and extend from an upper surface of said substrate to a lower surface of said substrate, said substrate having said light emitting element mounted thereon and said substrate having a substrate electrode, wherein a space is located between one surface of said light emitting element and said substrate, and wherein said electrodes of said light emitting element being electrically connected to said substrate electrode; and
   a glass covering said light emitting element and said glass having a glass transition temperature (Tg) of from 300° C. to 700° C., wherein said glass includes lead and has a melting point of at least 410° C. and wherein portions of said glass extend beyond portions of the corner arched side walls.

21. The light emitting device according to claim 20, wherein the space located between one surface of said light emitting element and said substrate includes an insulating material therein.

22. The light emitting device according to claim 20, wherein said light emitting element is covered with a covering member, and said covering member is covered with said glass.

23. The light emitting device according to claim 22, wherein said glass has a lenticular shape.

24. The light emitting device according to claim 20, wherein said glass has a lenticular shape.

* * * * *